US012457779B2

(12) United States Patent
Guler et al.

(10) Patent No.: US 12,457,779 B2
(45) Date of Patent: Oct. 28, 2025

(54) GATE CUT STRUCTURES

(71) Applicant: Intel Corporation, Santa Clara, CA (US)

(72) Inventors: Leonard P. Guler, Hillsboro, OR (US); Shengsi Liu, Portland, OR (US); Robert Joachim, Beaverton, OR (US); Mohammad Hasan, Aloha, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 727 days.

(21) Appl. No.: 17/687,045

(22) Filed: Mar. 4, 2022

(65) Prior Publication Data

US 2023/0282701 A1 Sep. 7, 2023

(51) Int. Cl.

| | |
|---|---|
| ***H01L 29/06*** | (2006.01) |
| ***H01L 27/088*** | (2006.01) |
| ***H01L 29/423*** | (2006.01) |
| ***H01L 29/786*** | (2006.01) |
| ***H10D 30/67*** | (2025.01) |
| ***H10D 62/10*** | (2025.01) |
| ***H10D 84/83*** | (2025.01) |

(52) U.S. Cl.

CPC ....... *H10D 62/121* (2025.01); *H10D 30/6713* (2025.01); *H10D 30/6735* (2025.01); *H10D 30/6757* (2025.01); *H10D 84/834* (2025.01)

(58) Field of Classification Search

CPC ............. H10D 62/121; H10D 30/6713; H10D 30/6735; H10D 30/6757; H10D 84/834; H10D 30/014; H10D 30/43; H10D 62/151; H10D 64/017; H10D 62/116; H10D 84/0149; H10D 84/0151; H10D 84/0147; H10D 84/038; B82Y 10/00

USPC .......................................................... 257/288

See application file for complete search history.

(56) References Cited

U.S. PATENT DOCUMENTS

| | | | | |
|---|---|---|---|---|
| 11,056,478 | B2 | 7/2021 | Wang et al. | |
| 2018/0277440 | A1 | 9/2018 | Yu et al. | |
| 2020/0091145 | A1 * | 3/2020 | Guha | H10D 84/834 |
| 2020/0098756 | A1 | 3/2020 | Lilak et al. | |

(Continued)

OTHER PUBLICATIONS

Extended European Search Report received for EP Application No. 23152936.3, dated Jul. 10, 2023. 10 pages.

*Primary Examiner* — Tong-Ho Kim
(74) *Attorney, Agent, or Firm* — Finch & Maloney PLLC

(57) ABSTRACT

Techniques are provided herein to form semiconductor devices having gate cut structures. Adjacent semiconductor devices having semiconductor regions (e.g., fins or nanoribbons) extending in a first direction have a gate structure that extends over the semiconductor regions in a second direction and are separated by a gate cut structure extending in the first direction and interrupting the gate structure. The gate cut structure further extends between adjacent source or drain regions (corresponding to the adjacent semiconductor devices). A dielectric liner on at least a sidewall and/or top surface of the source or drain regions and also extends up a sidewall surface of the gate cut structure. In some cases, the gate structure includes a gate dielectric present on the semiconductor regions, but not present on the gate cut structure. A contact may pass through the liner and at least partially land on a source or drain region.

20 Claims, 16 Drawing Sheets

804
702
702
702
902
702
702
702
304
302
304
302
304
202

1202
1204a
1204b
1202
902
1002
1002
1102
502
304
302
304
302
304
202

(56) References Cited

U.S. PATENT DOCUMENTS

| | | | | |
|---|---|---|---|---|
| 2021/0375857 | A1* | 12/2021 | Huang ................. | H10D 30/014 |
| 2022/0013410 | A1 | 1/2022 | You et al. | |
| 2022/0037496 | A1 | 2/2022 | Chen et al. | |

* cited by examiner

GATE CUT STRUCTURES

FIELD OF THE DISCLOSURE

The present disclosure relates to integrated circuits, and more particularly, to gate cut formation within transistor devices.

BACKGROUND

As integrated circuits continue to scale downward in size, a number of challenges arise. For instance, reducing the size of memory and logic cells is becoming increasingly more difficult. As features become smaller, the fabrication of certain features can have detrimental effects on surrounding features. Accordingly, there remain a number of non-trivial challenges with respect to semiconductor device formation.

Figure 1:
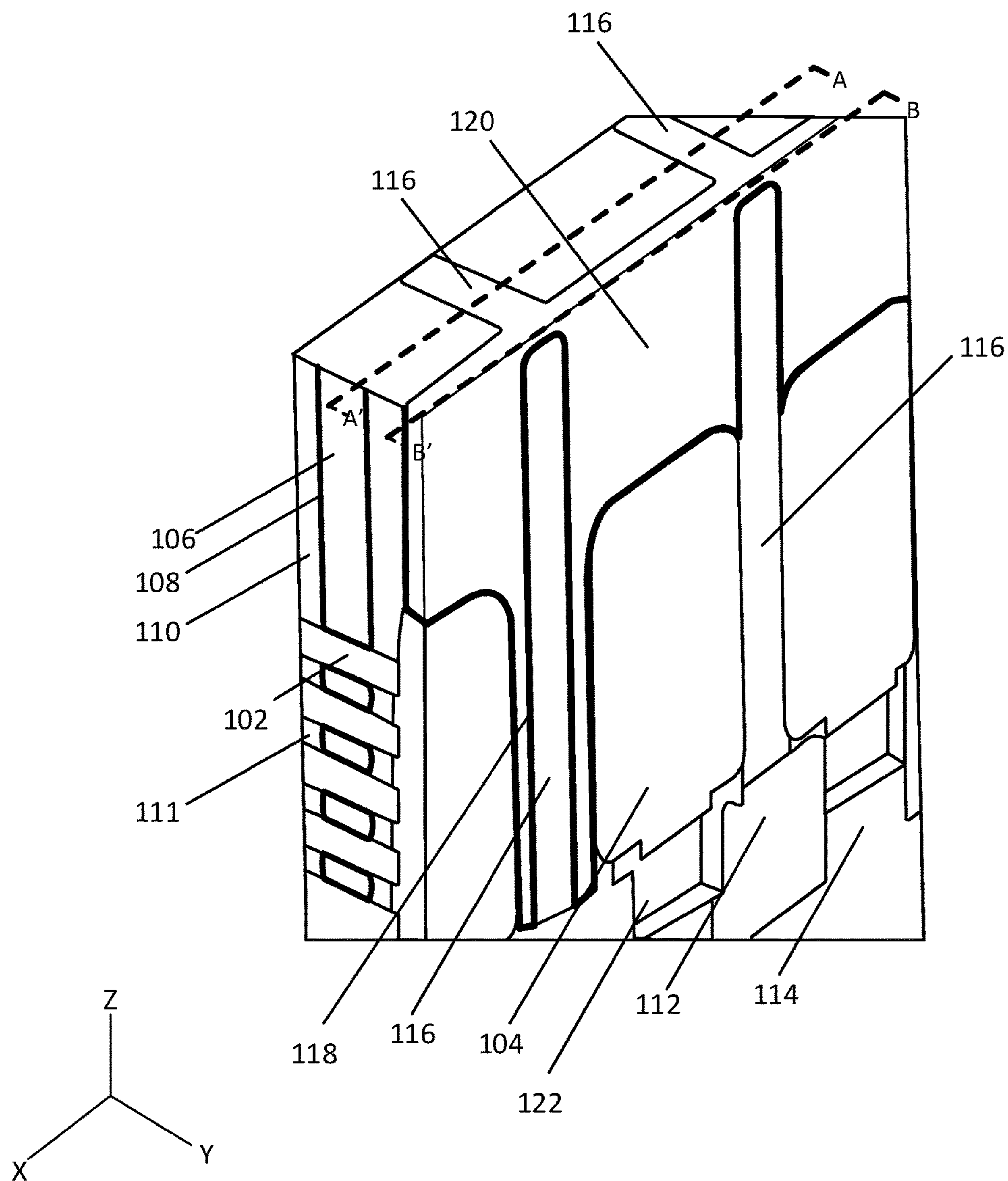
FIG. 1 is an isometric view of an integrated circuit structure that includes gate cut structures formed after gate metallization, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices having gate cut structures. The techniques can be used in any number of integrated circuit applications and are particularly useful with respect to logic and memory cells, such as those cells that use finFETs or gate-all-around transistors. In an example, adjacent semiconductor devices having semiconductor regions (e.g., fins or nanoribbons) extending in a first direction have a gate structure that extends over the semiconductor regions in a second direction and are separated by a gate cut structure extending in the first direction and interrupting the gate structure. The gate cut structure further extends between adjacent source or drain regions (corresponding to the adjacent semiconductor devices). A dielectric liner is at least on a sidewall and/or top surface the source or drain regions also extends up a sidewall surface of the gate cut structure thus indicating that the gate cut structure was formed before the formation of the source or drain regions. In some such cases, the gate structure includes a gate dielectric present on the semiconductor regions, but not present on the gate cut structure thus indicating that the gate cut structure was formed after the formation of the gate structure. Thus, the gate cut structure can be formed after the conductive gate structure and before the source and drain regions are formed. In this manner, the source and drain regions are not adversely impacted by the gate cut formation process. Numerous variations and embodiments will be apparent in light of this disclosure.

General Overview

As previously noted above, there remain a number of non-trivial challenges with respect to forming semiconductor devices. The gate structure and the source or drain regions of semiconductor devices may be sensitive to the processes occurring with the formation of the other. Accordingly, source or drain regions are sometimes formed before the formation of the final gate structure, in a replacement metal gate (RMG) or gate-last process. However, forming gate cut structures through the gate structure can interfere with the already-present source or drain regions. For example, etching the trenches through the different materials to designate areas for gate cut structures can cause undesired etching of the source or drain regions. To this end, merely changing the order in which certain structures are formed may not be enough to maintain the integrity of each of the various structures involved.

Thus, and in accordance with an embodiment of the present disclosure, techniques are provided herein to form epitaxial source or drain regions after the formation of any gate cut structures (and after formation of the gate structures). In other words, the source or drain region formation is postponed until later in the fabrication process after both the gate cut structures and gate structures are formed, by initially using sacrificial fill material in the source/drain regions, according to some embodiments. In one such example, once the source/drain trenches have been formed between spacer structures, the source/drain trenches are filled with a sacrificial fill material to plug up the trenches during the remaining operations to form the gate structures and gate cut structures. Gate structures may be formed first followed by gate cut structures extending through the gate structures and through the sacrificial fill material in the source/drain trenches. According to some embodiments, the sacrificial fill material is then removed and the formation of the epitaxial source or drain regions can occur. The presence of the gate cut structures may affect the growth pattern of the source or drain regions, according to some embodiments. Furthermore, in some embodiments, any dielectric liners formed over the source or drain regions will also form up the sidewalls of the gate cut structures within the source/drain trenches.

According to an embodiment, an integrated circuit includes a semiconductor device having a semiconductor region extending between a first source or drain region and a second source or drain region, a gate layer comprising a conductive material and extending over the semiconductor region, and a gate cut structure comprising a dielectric material. The gate cut structure is adjacent to the semiconductor region such that the gate cut structure interrupts the gate layer and further extends adjacent to the first source or drain region. The integrated circuit further includes a dielectric liner on at least a sidewall and/or top surface of the first source or drain region and also on at least a portion of a sidewall of the gate cut structure adjacent to the first source or drain region. The semiconductor region may include or fin (e.g., for tri-gate and double-gate finFETs) or one or more nanoribbons, nanowires, or nanosheets (e.g., for gate-all-around ribbonFETs).

According to another embodiment, an electronic device includes a chip package having one or more dies where at least one of the one or more dies includes a semiconductor device having a semiconductor region extending between a first source or drain region and a second source or drain region, a gate layer comprising a conductive material and extending over the semiconductor region, and a gate cut structure comprising a dielectric material. The gate cut structure is adjacent to the semiconductor region such that the gate cut structure interrupts the gate layer and further extends adjacent to the first source or drain region. The integrated circuit further includes a dielectric liner on at least a sidewall and/or top surface of the first source or drain region and also on at least a portion of a sidewall of the gate cut structure adjacent to the first source or drain region.

According to another embodiment, a method of forming an integrated circuit includes forming a fin comprising semiconductor material extending above a substrate surface; forming a sacrificial gate layer over the semiconductor material of the fin; forming a spacer structure on sidewalls of the sacrificial gate layer; removing exposed portions of the fin outside of the sacrificial gate layer and spacer structure; forming a sacrificial fill material adjacent to the spacer structure; replacing the sacrificial gate layer with a conductive gate layer; forming a gate cut structure comprising a dielectric material that extends through a width of the conductive gate layer and through the sacrificial fill material; removing the sacrificial fill material; forming a source or drain region from the exposed end or ends of the semiconductor material; and forming a dielectric liner over at least a sidewall and top surface of the source or drain region and also over a portion of a sidewall surface of the gate cut structure adjacent to the source or drain region. The method may further include forming a contact on the source or drain region, by etching a contact trench through dielectric fill material over the source or drain region and further etching through the dielectric liner to reach a top surface of the source or drain region. The contact can then be formed within the contact trench, on the source or drain region. The contact may include multiple layers, such as a barrier layer (e.g., tantalum nitride to reduce electromigration of contact metal into the dielectric fill), a resistance reducing layer (e.g., doped silicon or silicon germanium capping layer), and a metal plug (e.g., tungsten).

The techniques can be used with any type of non-planar transistors, including finFETs (sometimes called double-gate transistors, or tri-gate transistors), or nanowire, nanosheet, and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The source and drain regions may be any epitaxial diffusion region. Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of gate cut structure adjacent to a source or drain region where a dielectric liner is present on sidewalls and/or top surfaces of the source or drain region and also up the sidewall of the gate cut structure. The dielectric liner may be a different dielectric material compared to the dielectric material of the gate cut structure. Additionally, the same gate cut structure may extend through the gate structure (thus interrupting the gate structure between two semiconductor devices). However, the gate cut structure will not have a gate dielectric formed on it within the gate trench, given that the gate cut structure is formed after the gate structure (including the gate dielectric) is deposited. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1 is an isometric view of a portion of an integrated circuit that includes various parallel semiconductor devices, in accordance with an embodiment of the present disclosure. Each of the semiconductor devices may be non-planar metal oxide semiconductor (MOS) transistors, such as tri-gate or gate-all-around transistors, although other transistor topologies and types could also benefit from the techniques provided herein. The examples herein illustrate semiconductor devices with a GAA structure (e.g., having nanoribbons, nanowires, or nanosheets that extend between source and drain regions).

Each semiconductor device includes one or more semiconductor regions 102, such as one or more nanoribbons, nanowires, or nanosheets extending between epitaxial source or drain regions 104 in a first direction along the Y-axis. A gate structure that includes a gate layer 106 (e.g., a gate electrode) and a gate dielectric layer 108 extend over the one or more semiconductor regions 102 in a second direction (e.g. along the X-axis) to form the transistor gate. A given gate structure may extend over the semiconductor regions of more than one semiconductor device. It should be noted that the one or more semiconductor regions 102 of each device may also be fins in trigate transistor designs.

The semiconductor material used in each of the semiconductor devices may be formed from a semiconductor substrate. As noted above, the one or more semiconductor regions of the devices may include fins that can be, for example, native to the substrate (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In still other embodiments, the fins include alternating layers of material (e.g., alternating layers of silicon and SiGe) that facilitates forming of nanowires and nanoribbons (such as the illustrated semiconductor regions 102) during a gate forming process where one type of the alternating layers are selectively etched away so as to liberate the other type of alternating layers within the channel region, so that a gate-all-around process can then be carried out. Again, the alternating layers can be blanket deposited and then etched into fins or deposited into fin-shaped trenches.

Source or drain regions 104 may be formed at the ends of the one or more semiconductor regions 102 of each device, and thus may be aligned along the second direction from one another. According to some embodiments, source or drain regions 104 are epitaxial regions that are provided on the semiconductor regions in an etch-and-replace process. In other embodiments source or drain regions 104 could be, for example, implantation-doped native portions of the fins or substrate. Any semiconductor materials suitable for source or drain regions can be used (e.g., group IV and group III-V semiconductor materials). Source or drain regions 104 may include multiple layers such as liners and capping layers to improve contact resistance. In any such cases, the composition and doping of source or drain regions 104 may be the same or different, depending on the polarity of the transistors. Any number of source or drain configurations and materials can be used.

As noted above, a gate structure extends in the second direction over the one or more semiconductor regions 102 of various devices and includes both gate layer 106 and gate dielectric 108. Gate layer 106 may include any sufficiently conductive material such as a metal, metal alloy, or doped polysilicon. In some embodiments, gate layer 106 includes one or more workfunction metals around the one or more semiconductor regions. In some embodiments, p-channel devices include a workfunction metal having titanium around its one or more semiconductor regions and n-channel devices include a workfunction metal having tungsten around its one or more semiconductor regions. Gate layer 106 may also include a fill metal or other conductive material around the workfunction metals to provide the whole gate electrode structure. Gate dielectric 108 represents any number of dielectric layers that exist between the one or more semiconductor regions 102 and gate electrode 106.

According to some embodiments, spacer structures 110 are present on the sidewalls of the gate structure and define a gate trench through which the gate structure is formed. Spacer structures 110 may include a suitable dielectric material such as silicon nitride or silicon oxynitride. In some embodiments, gate dielectric 108 also forms along sidewalls of spacer structures 110. Inner spacers 111 are present between adjacent nanowires (e.g., semiconductor regions 102) and may be the same dielectric material as spacer structures 110 (but formed at a later time as will be discussed in more detail herein).

As can further be seen, a dielectric layer 112 extends across a bottom portion of the integrated circuit and between subfins 114 of each of the semiconductor devices, according to an embodiment. Dielectric layer 112 may include any suitable dielectric material such as silicon oxide. Dielectric layer 112 provides shallow trench isolation (STI) between adjacent semiconductor devices. According to some embodiments, subfins 114 are portions of the semiconductor fins that remain after formation of the various transistors and may be formed from the semiconductor substrate. Accordingly, subfins 114 may include the same semiconductor material as the one or more semiconductor regions 102 of the semiconductor devices.

According to some embodiments, a gate cut structure 116 extends across the gate structure in the first direction (e.g., parallel to the length of semiconductor regions 102) and also extends adjacent to source or drain region 104 within the source/drain trench. According to some embodiments, gate cut structure 116 includes any suitable dielectric material, such as silicon nitride, silicon oxide, or silicon oxynitride. Gate cut structure 116 may extend down to dielectric layer 112 and, in some cases, extend through a portion of dielectric layer 112. Gate cut structure 116 may be the same dielectric material as dielectric layer 112, such that a seam may not be observable between gate cut structure 116 and dielectric layer 112.

According to some embodiments, a dielectric liner 118 is provided over source or drain region 104 and on at least a portion of the sidewall of gate cut structure 116. Dielectric liner 118 may represent any number of dielectric layers formed to protect source or drain region 104. In some embodiments, dielectric liner 118 includes silicon nitride. Dielectric liner 118 may include any dielectric material that is different from the dielectric material of gate cut structure 116. Depending on the spacing between source or drain region 104 and an adjacent gate cut structure 116, dielectric liner 118 can be formed on an entirety of the sidewall of gate cut structure 116 (such as the left gate cut structure in FIG. 1) or only on a portion of the sidewall of gate cut structure 116 (such as the right gate cut structure in FIG. 1). Notably, gate cut structure 116 includes dielectric liner 118 on at least a portion of its sidewall within the source/drain trench but does not include gate dielectric 108 on its sidewall within the gate trench. The presence of dielectric liner 118 on gate cut structure 116 and the lack of gate dielectric 108 on gate cut structure 116 may be used to indicate that gate cut structure 116 was formed before the formation of source or drain region 104 (with dielectric liner 118) and after the formation of the gate structure (with gate dielectric 108).

A dielectric fill 120 may be used within the source/drain trench to fill any remaining areas with a dielectric material, according to some embodiments. Dielectric fill 120 may be any suitable dielectric material such as silicon oxide and may be the same dielectric material as gate cut structure 116. In other embodiments, dielectric fill 120 is elementally different from the dielectric material of gate cut structure 116, so that it can be selectively etched relative to the gate cut structure 116. Similarly, dielectric liner 118 can be elementally different from the dielectric material of gate cut structure 116, so that it too can be selectively etched relative to the gate cut structure 116. In some embodiments, at least a portion of dielectric fill 120 and dielectric liner 118 are removed to form topside conductive contacts to source or drain region 104 (such as shown in FIG. 12B).

According to some embodiments, a subregion 122 may exist below source or drain region 104. Subregion 122 may represent a portion of subfin 114 that was etched away, but not filled with the epitaxial material of source or drain region 104. In some embodiments, subregion 122 may include a dielectric material, such as the same dielectric material used to form inner spacers 111. In some embodiments, a void may exist within subregion 122 that is filled with an inert gas.

Fabrication Methodology

FIGS. 2A-12A and 2B-12B are cross-sectional views that collectively illustrate an example process for forming an integrated circuit configured with gate cut structures formed after gate metallization, in accordance with an embodiment of the present disclosure. FIGS. 2A-12A represent a cross-sectional view taken across plane A-A' (e.g., along the gate trench) as seen in FIG. 1, while FIGS. 2B-12B represent a cross-sectional view taken across plane B-B' (e.g., along the source/drain trench) as seen in FIG. 1. Each figure shows an example structure that results from the process flow up to that point in time, so the depicted structure evolves as the process flow continues, culminating in the structure shown in FIGS. 12A and 12B, which is similar to the structure shown in FIG. 1. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
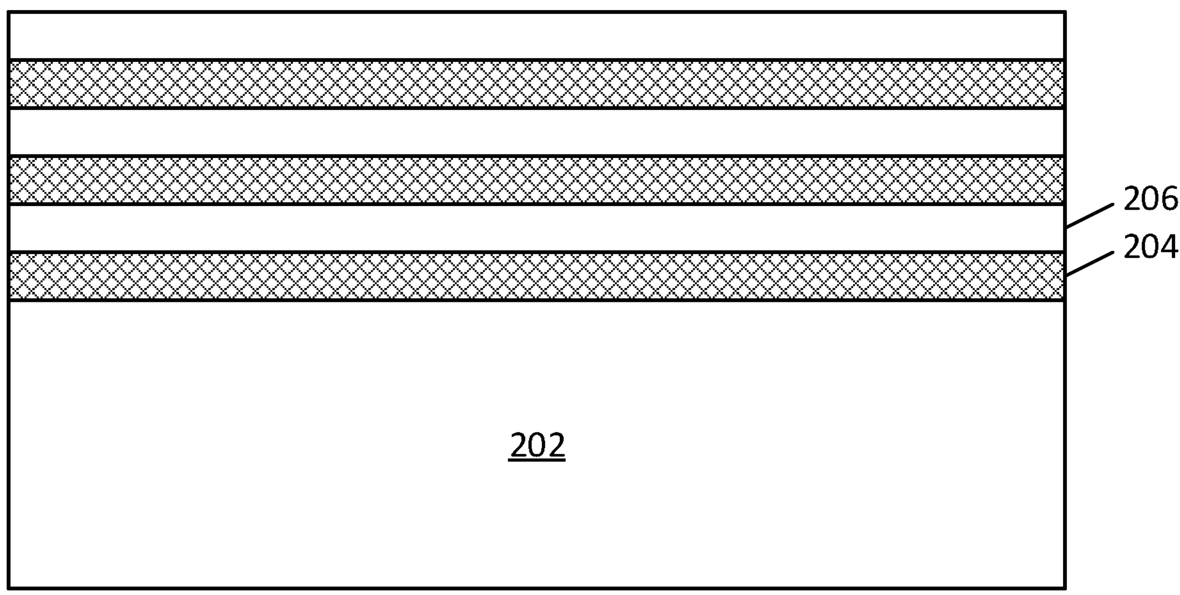
FIGS. 2A and 2B are cross-sectional views that illustrate one stage in an example process for forming an integrated circuit configured with gate cut structures formed after gate metallization, in accordance with an embodiment of the present disclosure.
Figure 2B:
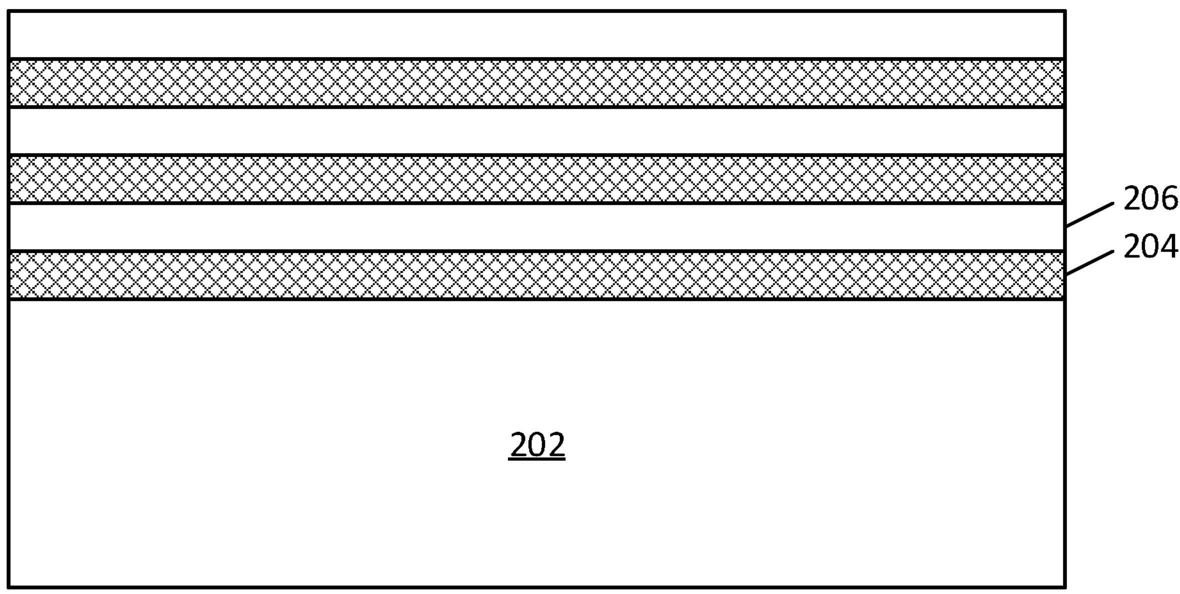

FIGS. 2A and 2B illustrate cross-sectional views taken through a stack of alternating material layers formed on a semiconductor substrate 202. Substrate 202 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 202 can be a semiconductor-on-insulator substrate having a desired semiconductor layer over a buried insulator layer (e.g., silicon over silicon dioxide). Alternatively, substrate 202 can be a multilayer substrate or superlattice suitable for forming nanowires or nanoribbons (e.g., alternating layers of silicon and SiGe, or alternating layers indium gallium arsenide and indium phosphide). Any number of substrates can be used.

According to some embodiments, the alternating layer stack includes sacrificial layers 204 and semiconductor layers 206. Semiconductor layers 206 may include silicon, germanium, or any combination thereof. Sacrificial layers 204 have a different material composition than semiconductor layers 206. In some embodiments, sacrificial layers 204 include some combination of silicon and germanium. While dimensions can vary from one example embodiment to the next, in one example case, the total height of the stack of alternating layers may be between 50 nm and 150 nm. The thickness of each of semiconductor layer 206 and sacrificial layer 204 may be between about 5 nm and about 25 nm.

Figure 3A:
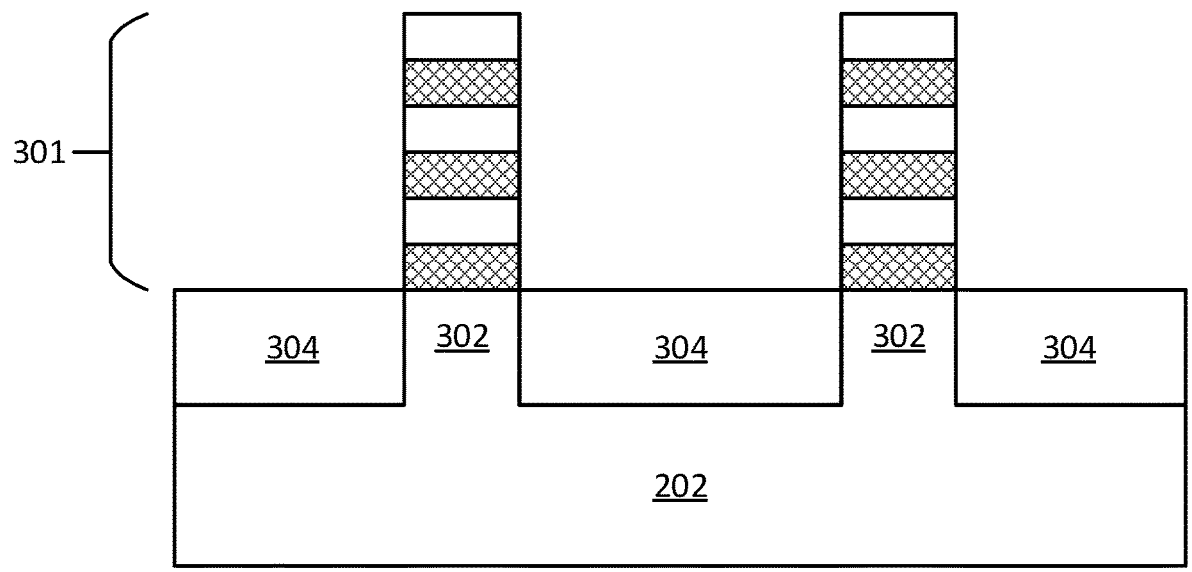
FIGS. 3A and 3B are cross-sectional views that illustrate another stage in the example process for forming an integrated circuit configured with gate cut structures formed after gate metallization, in accordance with an embodiment of the present disclosure.
Figure 3B:
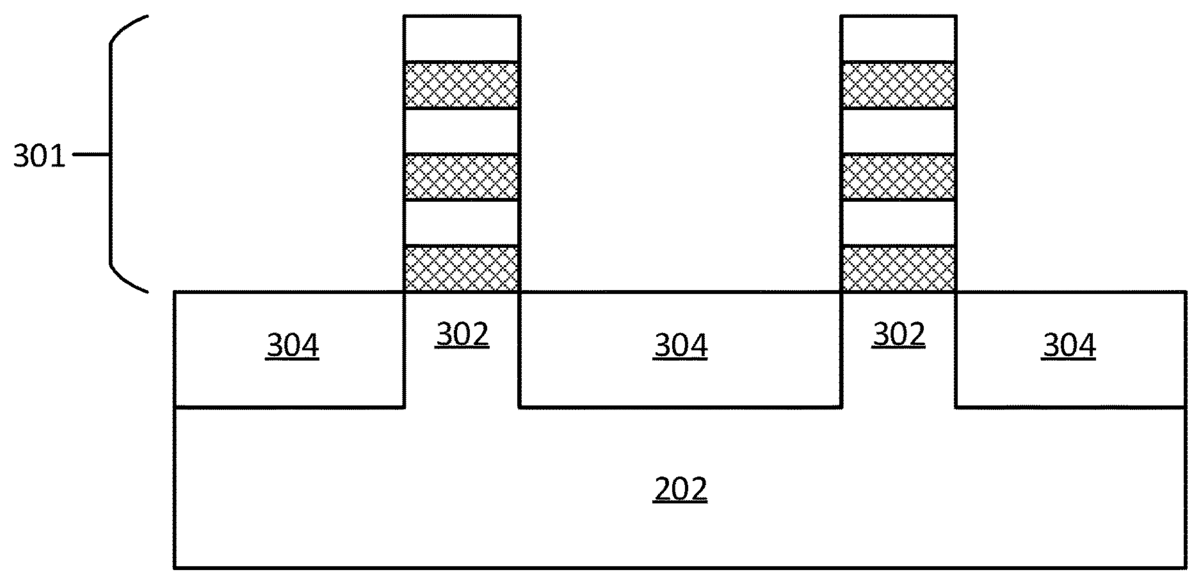

FIGS. 3A and 3B depict the cross-section views of the structure shown in FIGS. 2A and 2B, respectively, following the formation of any number of parallel fins 301 formed over semiconductor substrate 202. In this example, each fin 301 includes alternating layers of sacrificial layers 204 and semiconductor layers 206 in order to ultimately form nanowires or nanoribbons in a gate-all-around (GAA) structure. In other examples, fins 301 include a single semiconductor material (e.g., silicon or germanium).

According to some embodiments, an anisotropic etching process is performed to define fins 301 and also etch into a portion of substrate 202. The portions of substrate 202 that remain beneath the fins 301 provide subfin regions 302. According to some embodiments, fins 301 extend above a dielectric layer 304 that acts as an STI region between adjacent fins. Dielectric layer 304 may include silicon oxide. According to some embodiments, each fin 301 includes subfin region 302 between dielectric layer 304. While dimensions can vary from one example embodiment to the next, in one example case, the total height of fins 301 (e.g., extending above dielectric layer 304) may be between 50 nm and 150 nm, and the width of each of fins 301 can be, for example, in the range of 5 to 100 nm.

Figure 4A:
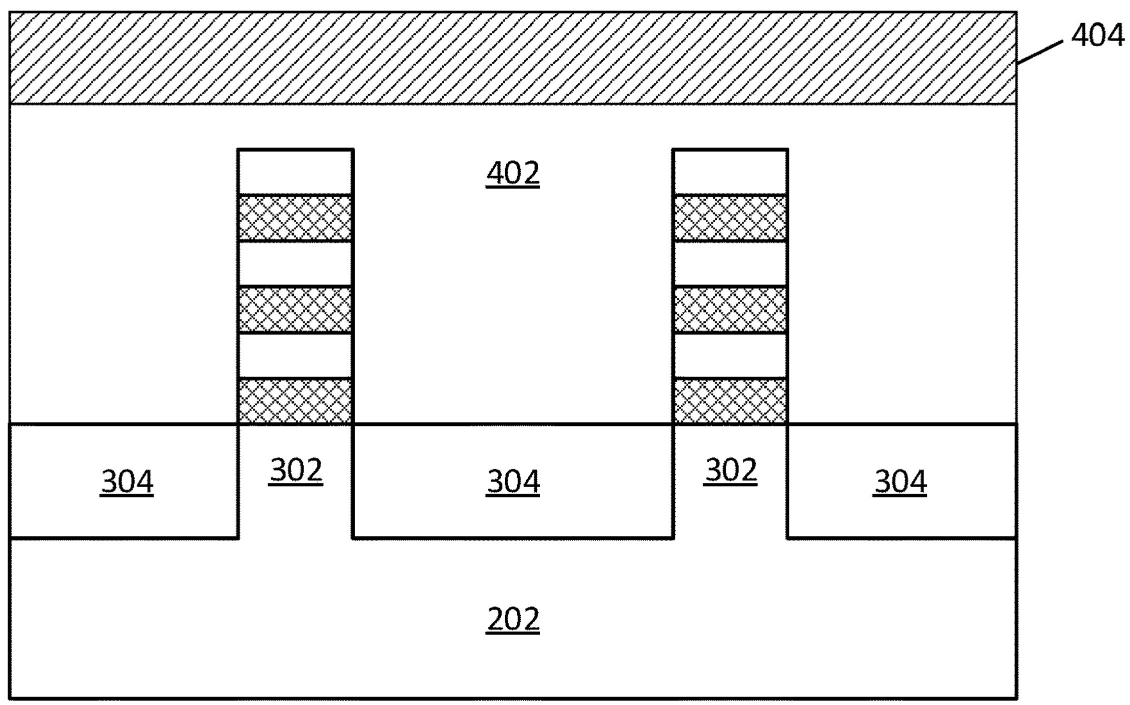
FIGS. 4A and 4B are cross-sectional views that illustrate another stage in the example process for forming an integrated circuit configured with gate cut structures formed after gate metallization, in accordance with an embodiment of the present disclosure.
Figure 4B:
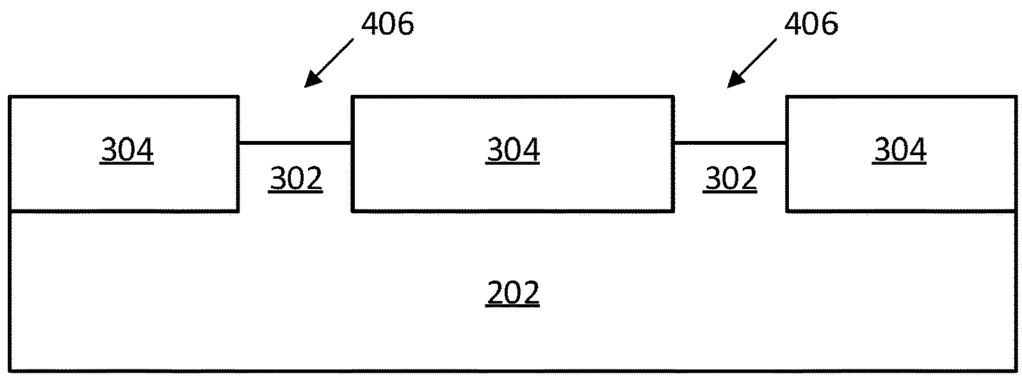

FIGS. 4A and 4B depict the cross-section views of the structure shown in FIGS. 3A and 3B, respectively, following the formation of a sacrificial gate 402 (and spacer structures) and the removal of the exposed portions of fin 301. A gate masking layer 404 may be used as a hard mask to lithographically pattern sacrificial gate 402 in strips that extend orthogonally across fins 301. According to some embodiments, the sacrificial gate material is removed in all areas not protected by gate masking layers 404. Gate masking layer 404 may be any suitable hard mask material such as CHM or silicon nitride. Sacrificial gate 402 may be any suitable material that can be selectively removed without damaging the semiconductor material of the fins. In some examples, sacrificial gate 402 includes polysilicon. Although not shown in this cross-sectional view, spacer structures may also be formed on sidewalls of sacrificial gate 402 and gate masking layers 404 and can include any suitable dielectric material, such as silicon nitride. In some embodiments, gate masking layers 404 are removed such that the spacer structures form on the sidewalls of only sacrificial gate 402.

FIG. 4B illustrates the view across an area outside of where sacrificial gate 402 (and the spacer structures) are formed. Accordingly, the exposed fins in this area are etched away using an anisotropic etching process that cuts through each layer of the alternating layer stack. In some embodiments, the etch continues into a portion of subfin regions 302 forming recesses 406 beneath a top surface of dielectric layer 304. Other materials adjacent to or directly on the fins may also be removed during this etching process, such as any portions of the spacer structures that formed on the fins.

Figure 5A:
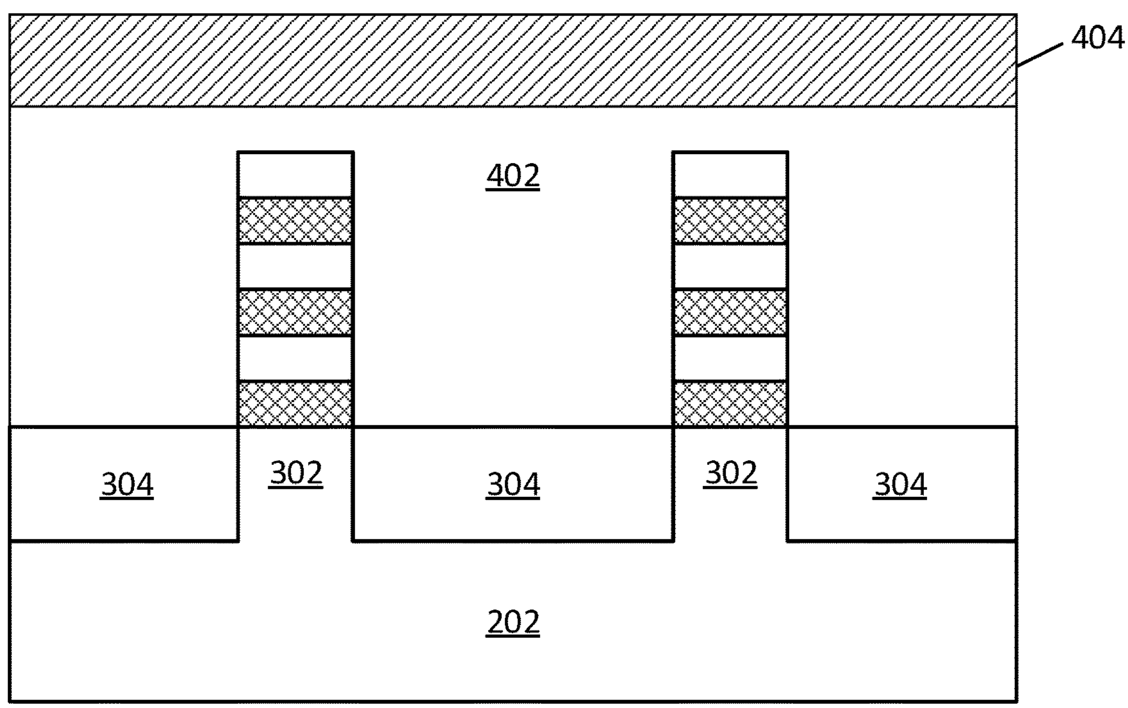
FIGS. 5A and 5B are cross-sectional views that illustrate another stage in the example process for forming an integrated circuit configured with gate cut structures formed after gate metallization, in accordance with an embodiment of the present disclosure.
Figure 5B:
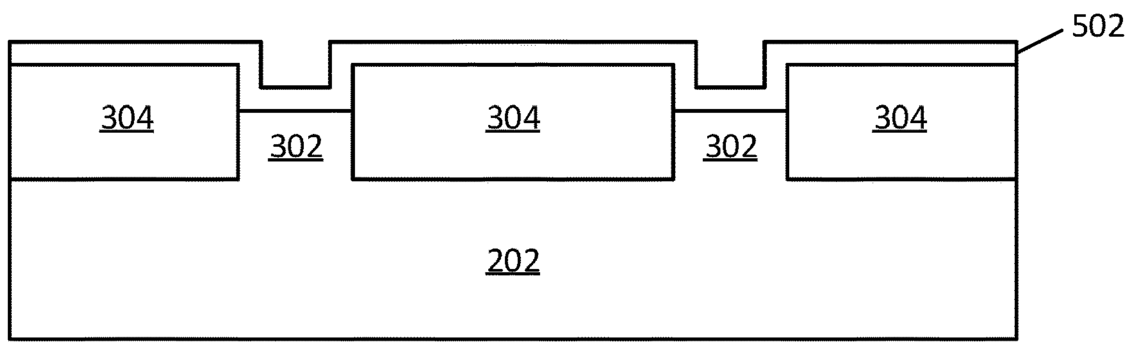

FIGS. 5A and 5B depict the cross-section views of the structure shown in FIGS. 4A and 4B, respectively, following the formation of an additional dielectric layer 502. According to some embodiments, prior to the deposition of additional dielectric layer 502, the exposed ends of sacrificial layers 204 in each of the fins 301 are laterally recessed using an isotropic etching process that selectively etches sacrificial layers 204 as opposed to semiconductor layers 206. Afterwards, additional dielectric layer 502 is deposited to effectively fill the dimples between semiconductor layers 206, according to some embodiments. Additional dielectric layer 502 can then be etched back using RIE or a wet isotropic etch at least until the ends of semiconductor layers 206 are exposed. However, portions of additional dielectric layer 502 may also remain along the bottom of the source/drain trench, as seen in FIG. 5B.

According to some embodiments, additional dielectric layer 502 has the same material composition as the spacer structures. It should be noted that additional dielectric layer 502 may only be present when using a gate-all-around (GAA) structure having semiconductor nanoribbons, nanowires, or nanosheets.

Figure 6A:
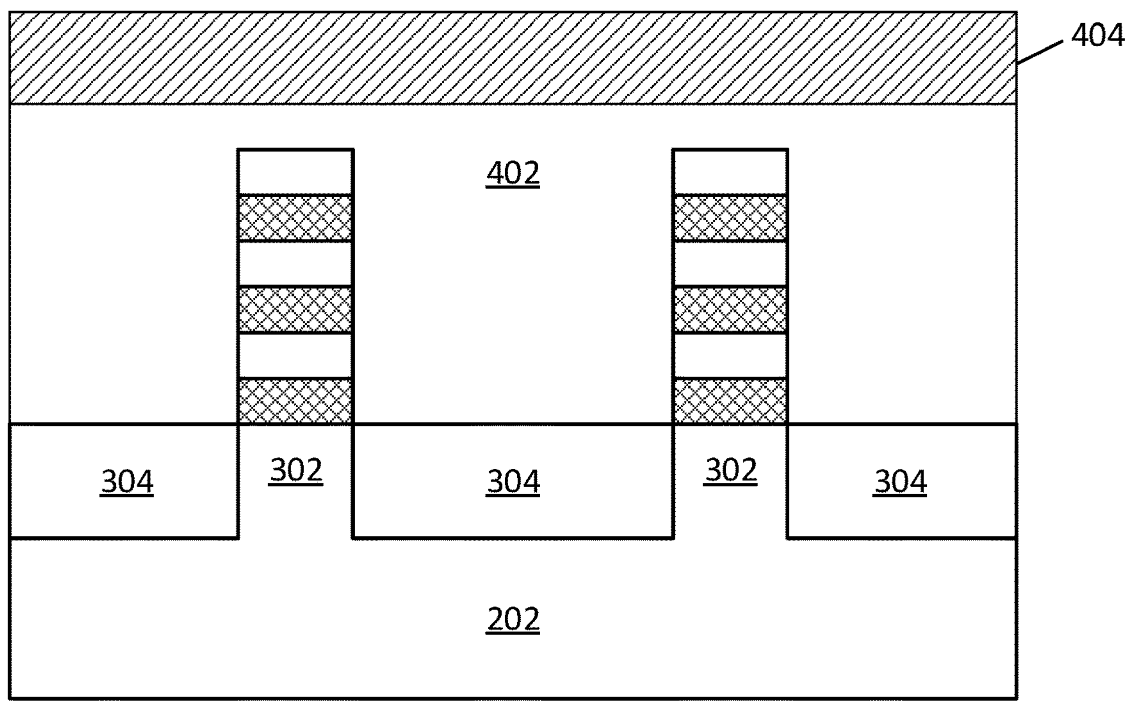
FIGS. 6A and 6B are cross-sectional views that illustrate another stage in the example process for forming an integrated circuit configured with gate cut structures formed after gate metallization, in accordance with an embodiment of the present disclosure.
Figure 6B:
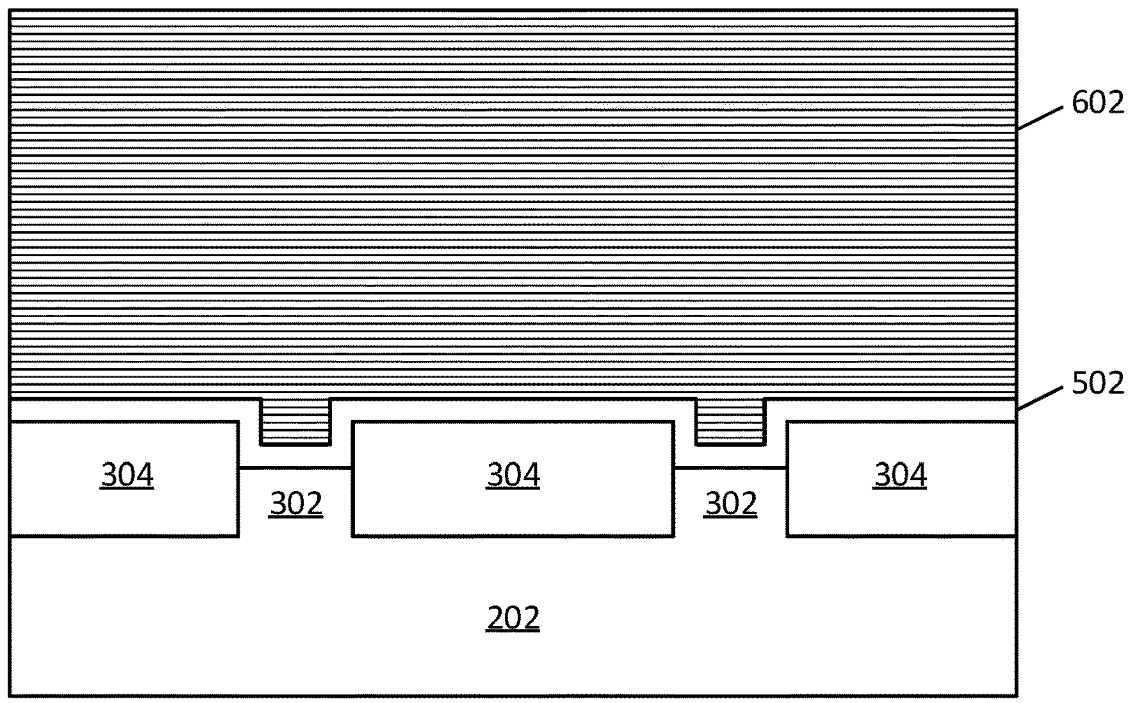

FIGS. 6A and 6B depict the cross-section views of the structure shown in FIGS. 5A and 5B, respectively, following the formation of sacrificial fill 602 within the source/drain trench. Any material may be used for sacrificial fill 602 that can be selectively removed at a later time without causing damage to the adjacent structures. Some example materials for sacrificial fill 602 include titanium nitride (TiN), aluminum oxide ($Al_2O_3$), or tungsten (W). Sacrificial fill 602 may be deposited using any chemical vapor deposition (CVD) technique. A top surface of sacrificial fill 602 may be polished using, for example, chemical mechanical polishing (CMP) such that it is substantially planar with a top surface of either gate masking layer 404 or sacrificial gate 402 (if gate masking layer 404 has been removed). Sacrificial fill 602 may be provided as a dummy material to plug the source/drain trench during the formation of the gate structure and gate cut structures.

Figure 7A:
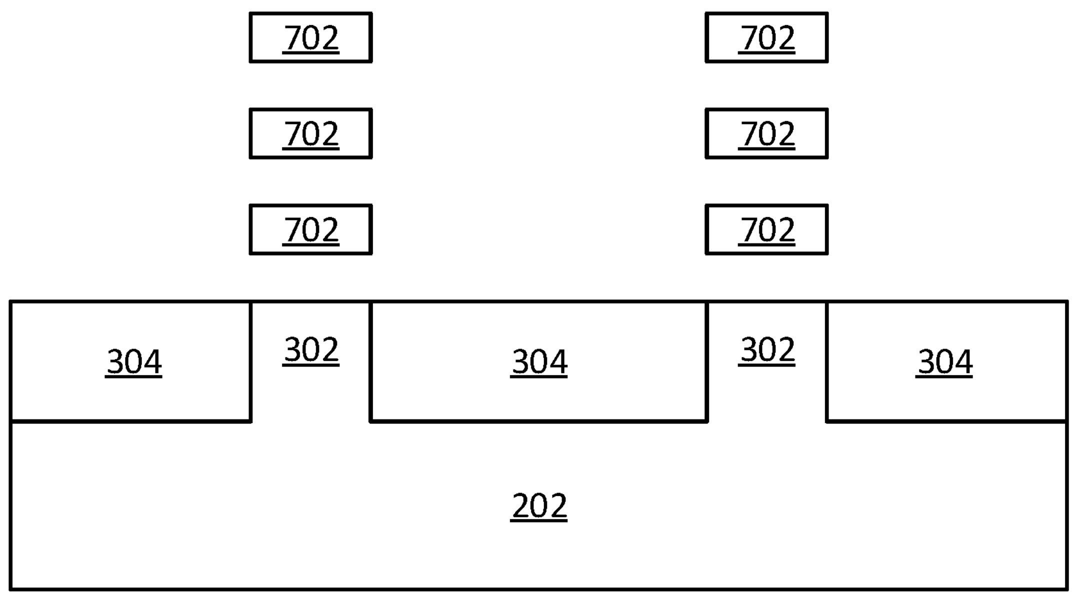
FIGS. 7A and 7B are cross-sectional views that illustrate another stage in the example process for forming an integrated circuit configured with gate cut structures formed after gate metallization, in accordance with an embodiment of the present disclosure.
Figure 7B:
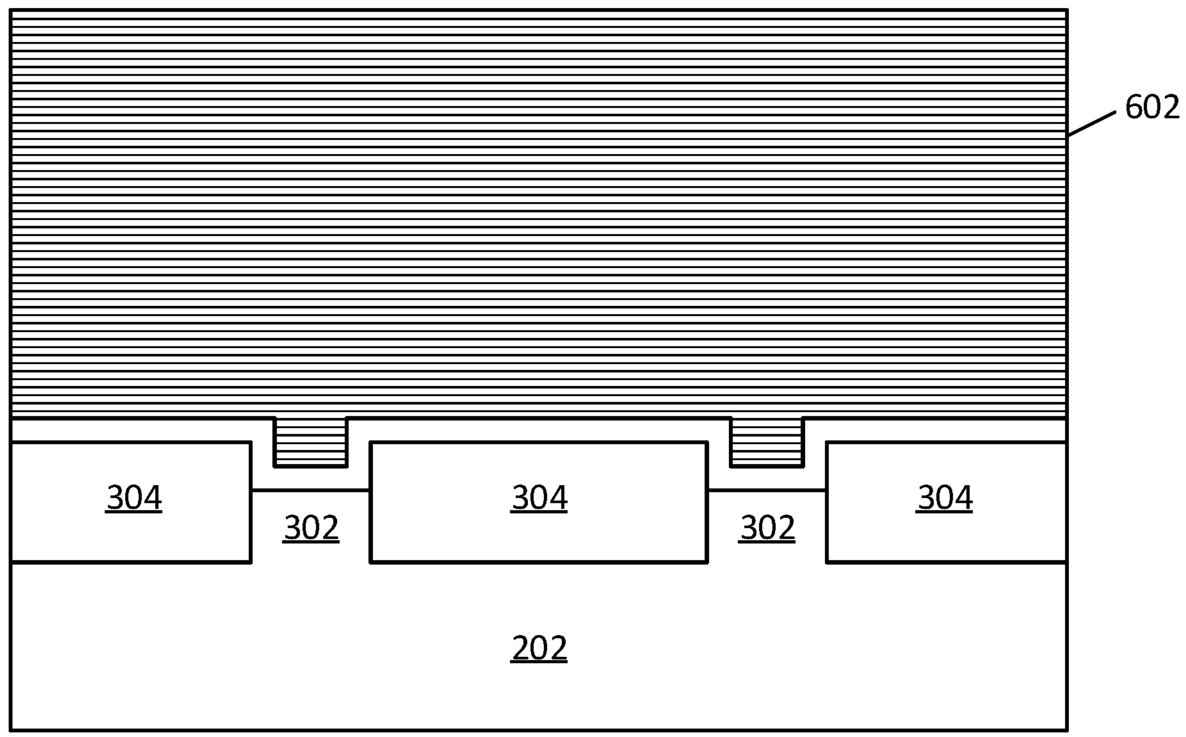

FIGS. 7A and 7B depict the cross-section views of the structure shown in FIGS. 6A and 6B, respectively, following the removal of sacrificial gates 402 and sacrificial layers 204, according to some embodiments. In examples where gate masking layers 404 are still present, they would be removed at this time. Once sacrificial gates 402 are removed, the fins extending between the spacer structures are exposed.

In the example where the fins include alternating semiconductor layers, sacrificial layers 204 are selectively removed to leave behind nanoribbons 702 that extend between the spacer structures. Each vertical set of nanoribbons 702 represents the semiconductor region of a different semiconductor device. It should be understood that nanoribbons 702 may also be nanowires or nanosheets. Sacrificial gates 402 and sacrificial layers 204 may be removed using the same isotropic etching process or different isotropic etching processes.

Figure 8A:
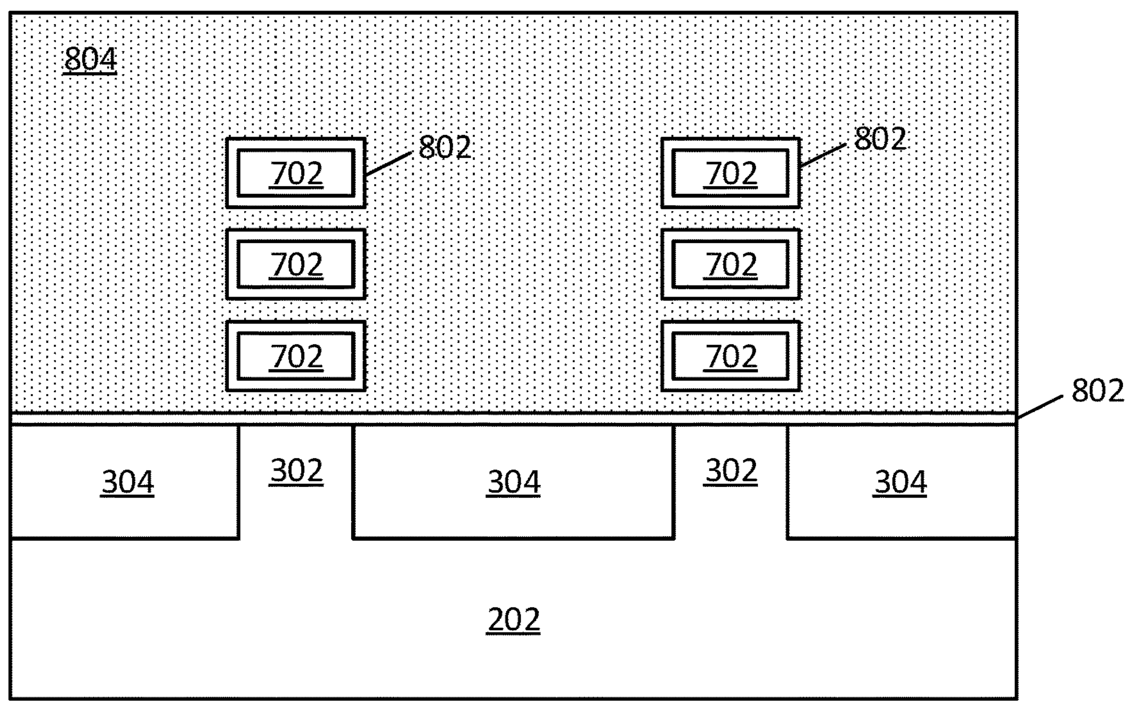
FIGS. 8A and 8B are cross-sectional views that illustrate another stage in the example process for forming an integrated circuit configured with gate cut structures formed after gate metallization, in accordance with an embodiment of the present disclosure.
Figure 8B:
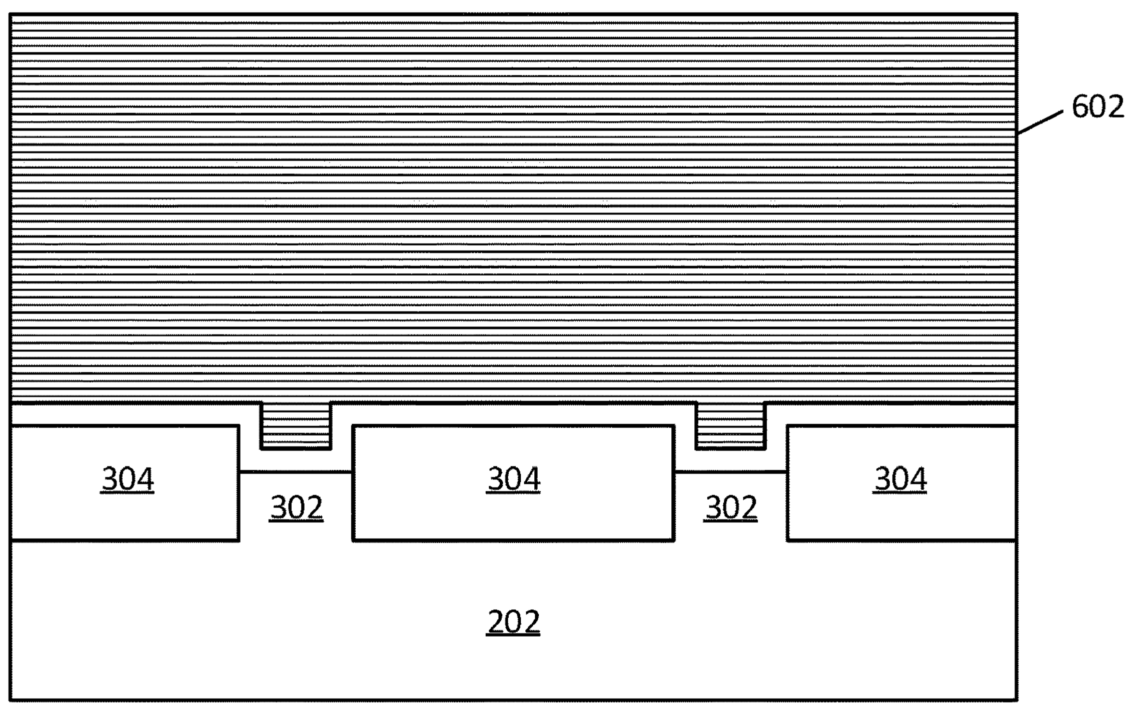

FIGS. 8A and 8B depict the cross-section views of the structure shown in FIGS. 7A and 7B, respectively, following the formation of a gate structure across one or more semiconductor regions and subsequent polishing, according to some embodiments. The gate structure includes a gate dielectric 802 and a conductive gate layer 804. Gate dielectric 802 may be first formed around nanoribbons 702 prior to the formation of gate layer 804. Gate dielectric 802 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 802 includes a layer of hafnium oxide with a thickness between about 1 nm and about 5 nm. In some embodiments, gate dielectric 802 may include one or more silicates (e.g., titanium silicate, tungsten silicate, niobium silicate, and silicates of other transition metals). In some cases, gate dielectric 802 may include a first layer on nanoribbons 702, and a second layer on the first layer. The first layer can be, for instance, an oxide of the semiconductor material of nanoribbons 702 (e.g., silicon dioxide) and the second layer can be a high-k dielectric material (e.g., hafnium oxide). Gate dielectric 802 may form along all surfaces exposed within the gate trench between the spacer structures, such as on the top surfaces of dielectric layer 304 and subfin regions 302, and along inner sidewalls of the spacer structures.

As noted above, gate layer 804 may represent any number of conductive layers. Gate layer 804 may be deposited using electroplating, electroless plating, CVD, plasma enhanced CVD (PECVD), atomic layer deposition (ALD), or physical vapor deposition (PVD), to name a few examples. In some embodiments, gate layer 804 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate layer 804 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Figure 9A:
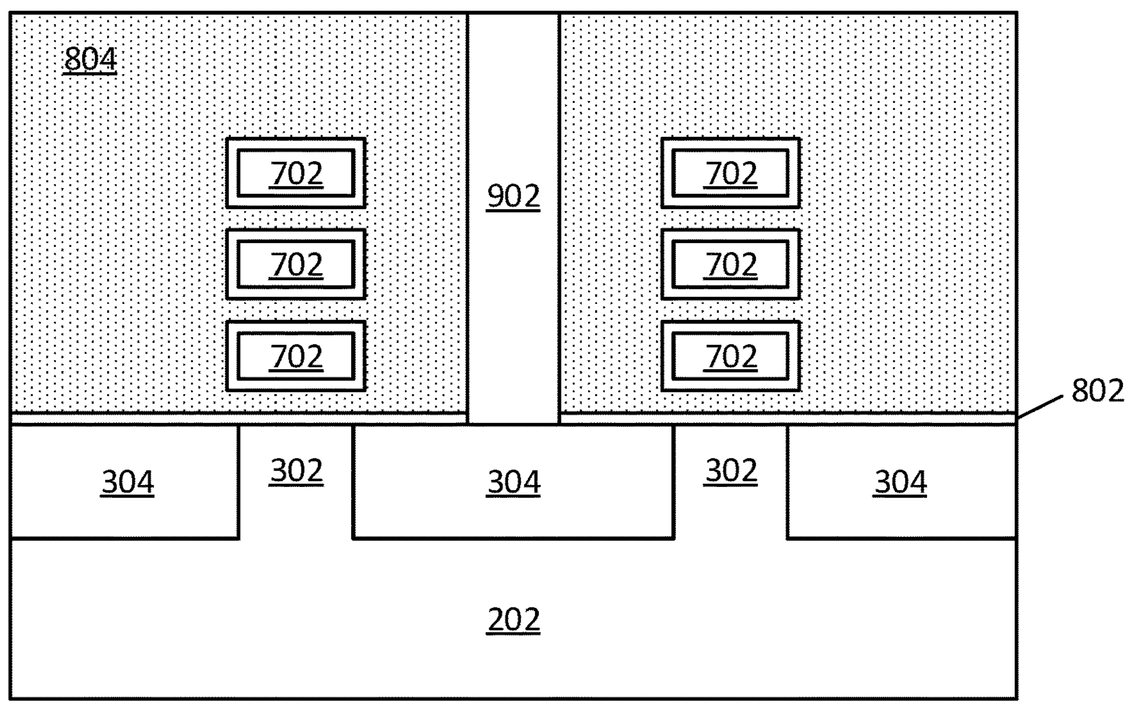
FIGS. 9A and 9B are cross-sectional views that illustrate another stage in the example process for forming an integrated circuit configured with gate cut structures formed after gate metallization, in accordance with an embodiment of the present disclosure.
Figure 9B:
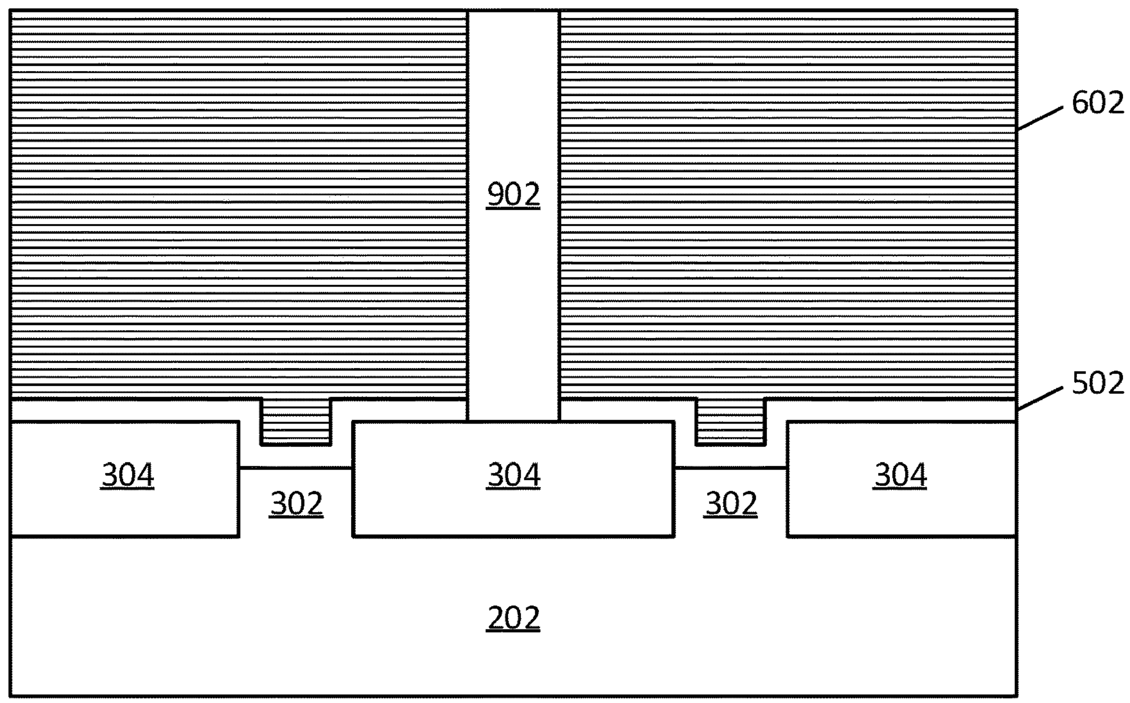

FIGS. 9A and 9B depict the cross-section views of the structure shown in FIGS. 8A and 8B, respectively, following the formation of a gate cut structure 902 between adjacent semiconductor devices, according to some embodiments. Gate cut structure 902 extends in the first direction (e.g., into/out of the page) through both the gate trench (FIG. 9A) and the source/drain trench (FIG. 9B). Accordingly, gate cut structure 902 interrupts the gate structure (and specifically gate layer 804) between the adjacent semiconductor devices and also cuts through sacrificial fill 602.

An anisotropic etching process may be performed through the various materials, such as gate layer 804, the spacer structures, and sacrificial fill 602 to define a trench-like recess for the gate cut structure, according to some embodiments. The recess may then be filled with one or more dielectric materials to form gate cut structure 902. In some examples, gate cut structure 902 includes silicon oxide, silicon nitride, or silicon oxynitride. Gate cut structure 902 extends through an entire thickness of gate layer 804. In some embodiments, gate cut structure 902 extends through at least a portion of gate dielectric 802 and/or additional dielectric layer 502. According to some embodiments, gate dielectric 802 is not present along the sidewalls of gate cut structure 902 as seen in FIG. 9A, since gate cut structure 902 is formed after the formation of the gate structure.

Figure 10A:
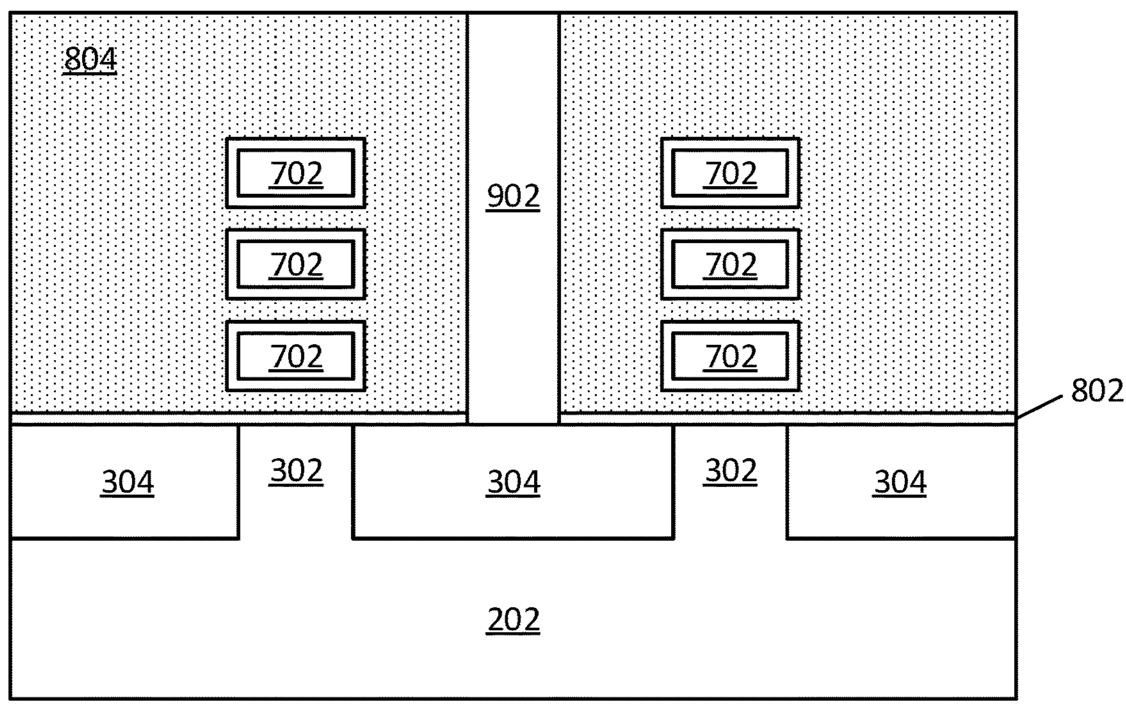
FIGS. 10A and 10B are cross-sectional views that illustrate another stage in the example process for forming an integrated circuit configured with gate cut structures formed after gate metallization, in accordance with an embodiment of the present disclosure.
Figure 10B:
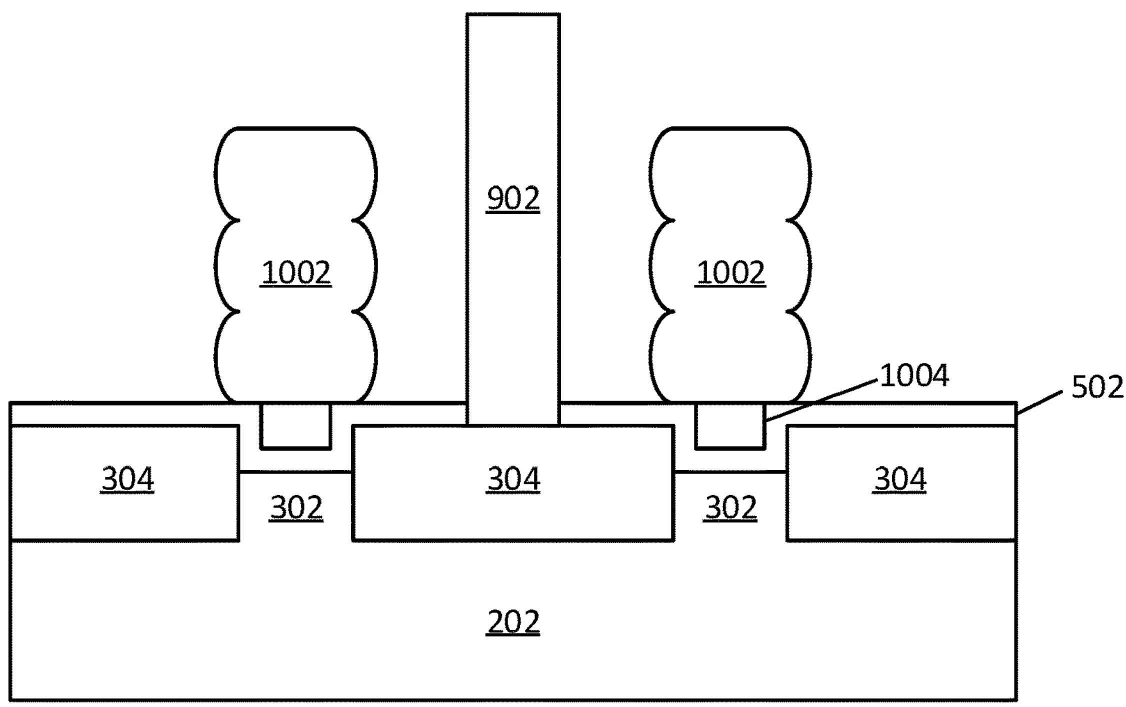

FIGS. 10A and 10B depict the cross-section views of the structure shown in FIGS. 9A and 9B, respectively, following the removal of sacrificial fill 602 and the formation of source or drain regions 1002, according to some embodiments. Source or drain regions 1002 may be epitaxially grown from the exposed ends of nanoribbons 702, such that the material grows together or otherwise merges towards the middle of the source/drain trench. In other embodiments, the epitaxial growth may only partially merge, or not merge at all thereby leaving space between the laterally adjacent epi-growths in which contact material can be deposited. Further note that epitaxial growth from the end of one nanoribbon 702 can fully or partially merge with epitaxial growth from the end of one or more other nanoribbons 702 in the same vertical stack. The degree of any such merging can vary from one embodiment to the next. In the example of PMOS device, source or drain regions 1002 may be a semiconductor material (e.g., group IV or group III-V semiconductor materials) having a higher dopant concentration of p-type dopants compared to n-type dopants. In the example of an NMOS device, source or drain regions 1002 may be a semiconductor material (e.g., group IV or group III-V semiconductor materials) having a higher dopant concentration of n-type dopants compared to p-type dopants. According to some embodiments, gate cut structure 902 is present adjacent to source or drain regions 1002 during their formation.

As seen in FIG. 10B, a void 1004 may exist between the bottom of source or drain regions 1002 and the top surface of subfin region 302. Additional dielectric layer 502 may occupy much of the space within void 1004. In some examples, void 1004 includes a trapped gas used during the epitaxial growth process to form source or drain regions 1002. In some examples, void 1004 is under vacuum. In still other examples, void 1004 may be filled or mostly filled with dielectric fill material deposited after source or drain regions 1002 are formed.

Figure 11A:
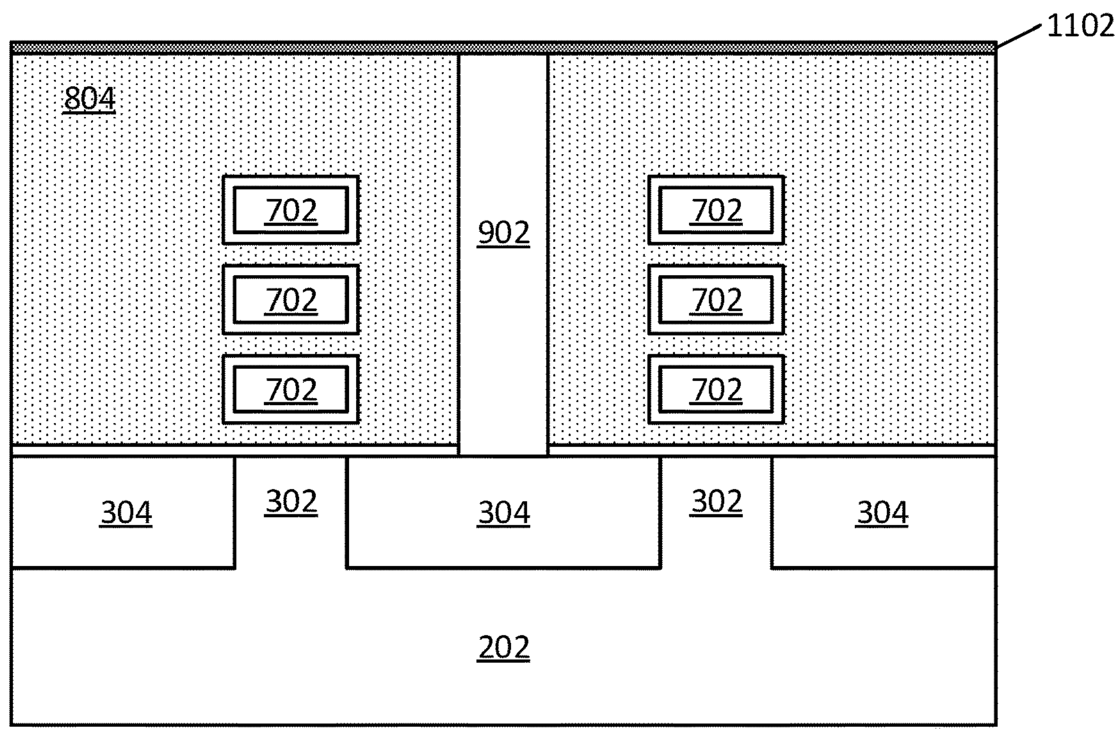
FIGS. 11A and 11B are cross-sectional views that illustrate another stage in the example process for forming an integrated circuit configured with gate cut structures formed after gate metallization, in accordance with an embodiment of the present disclosure.
Figure 11B:
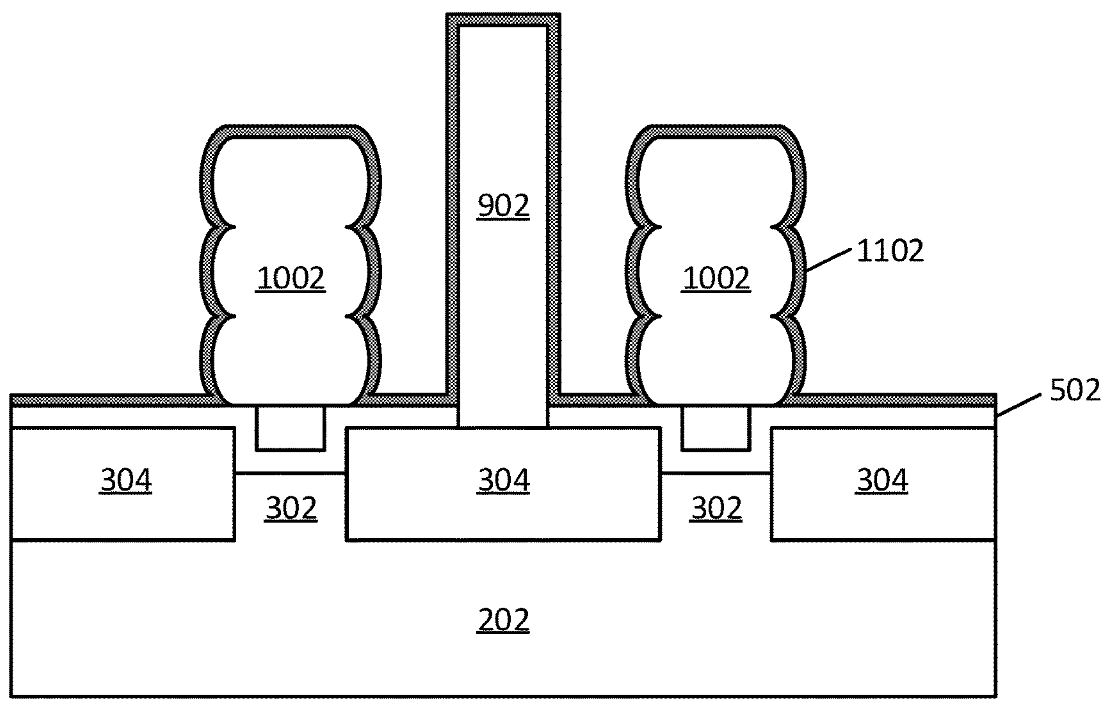

FIGS. 11A and 11B depict the cross-section views of the structure shown in FIGS. 10A and 10B, respectively, following the formation of a dielectric liner 1102 over source or drain regions 1002, according to some embodiments. Dielectric liner 1102 may represent any number of dielectric layers deposited over source or drain regions 1002 to protect them. In one example, dielectric liner 1102 includes a silicon nitride layer, although any suitable dielectric material may be used. In an example, dielectric liner 1102 includes a different dielectric material compared to gate cut structure 902. The thickness of liner 1102 can vary from one embodiment to the next, but in some cases is in the range of 1 nm to 5 nm. Dielectric liner 1102 may be conformally deposited, for example, using ALD or any other suitable deposition process.

Due to the presence of gate cut structure 902 within the source/drain trench, dielectric liner 1102 extends not only around the source/drain regions 1002 but also up at least a portion of the sidewall of gate cut structure 902. In some embodiments, enough distance separates source or drain region 1002 from gate cut structure 902 that dielectric liner

1102 extends up an entire sidewall surface of gate cut structure 902. Dielectric liner 1102 may also extend over a top surface of gate cut structure 902 and over a top surface of the gate structure following its deposition.

Figure 11C:
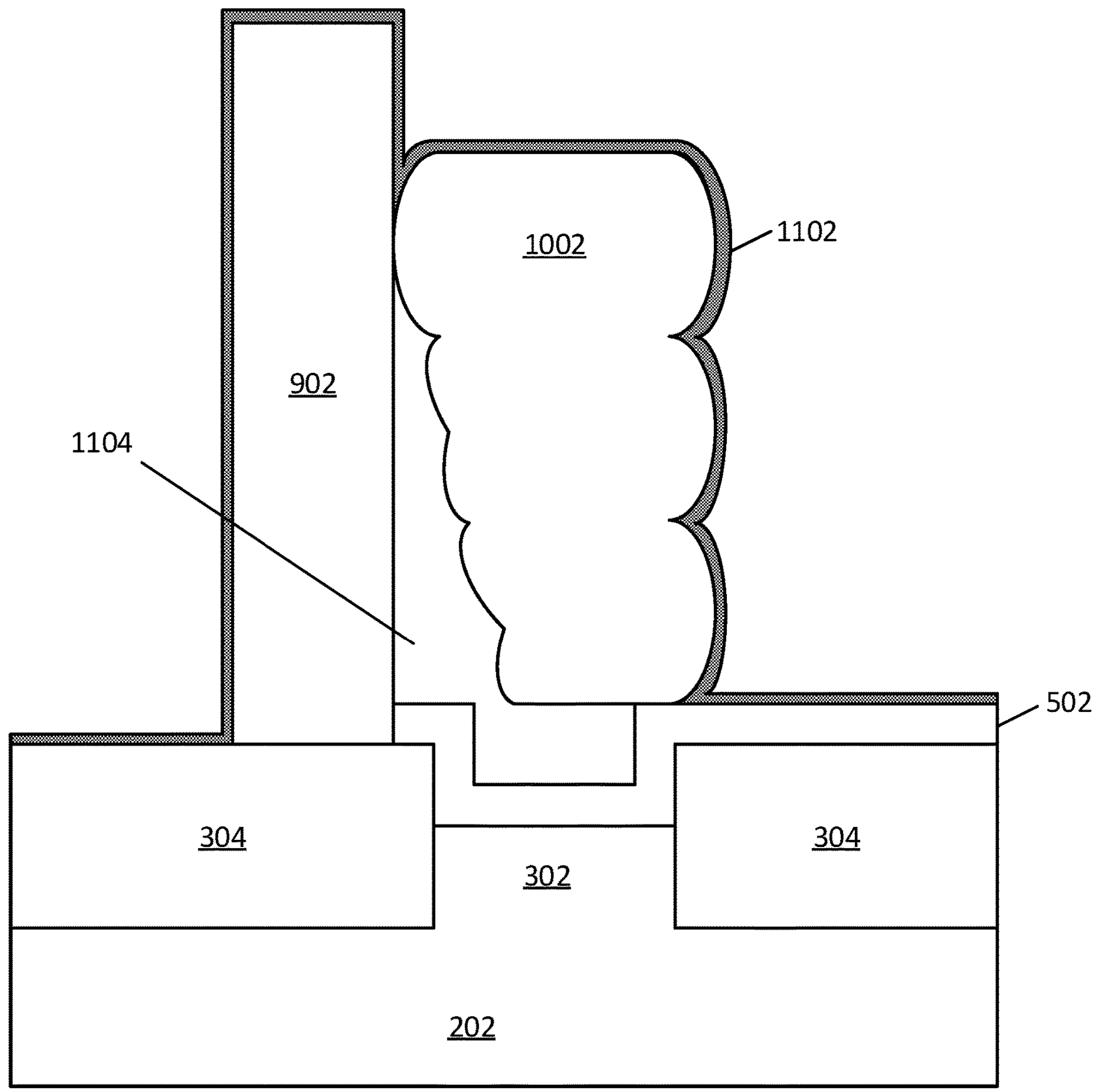
FIG. 11C is a cross-sectional view that illustrates an alternative stage in the example process for forming an integrated circuit configured with gate cut structures formed after gate metallization, in accordance with an embodiment of the present disclosure.

According to some embodiments, source or drain region 1002 may grow up against an adjacent gate cut structure 902, which can affect its growth profile. FIG. 11C illustrates one such example, where source or drain region 1002 has grown against the adjacent gate cut structure 902. Once any portion of source or drain region 1002 contacts gate cut structure 902, it can effectively pinch off any further growth occurring below it. This can occur since the reactive gas and/or plasma in the growth chamber can no longer reach (or is more difficult to reach) the lower portion of the source or drain region 1002. Accordingly, a void 1104 can form between source or drain region 1002 and the adjacent gate cut structure 902. The shape and size of void 1104 can vary from one layout and process to the next, as will be appreciated. In some embodiments, a gas may be trapped within void 1104, while in other embodiments void 1104 may be devoid of any gas (a vacuum). Since the lower portion of gate cut structure 902 is effectively blocked due to the growth of source or drain region 1002, dielectric liner 1102 may form on only the exposed upper portion of cut structure 902. FIG. 11C illustrates an example of this situation where dielectric liner 1102 extends around the exposed outer surface of source or drain region 1002 and up a portion of the exposed right sidewall of gate cut structure 902.

Figure 12A:
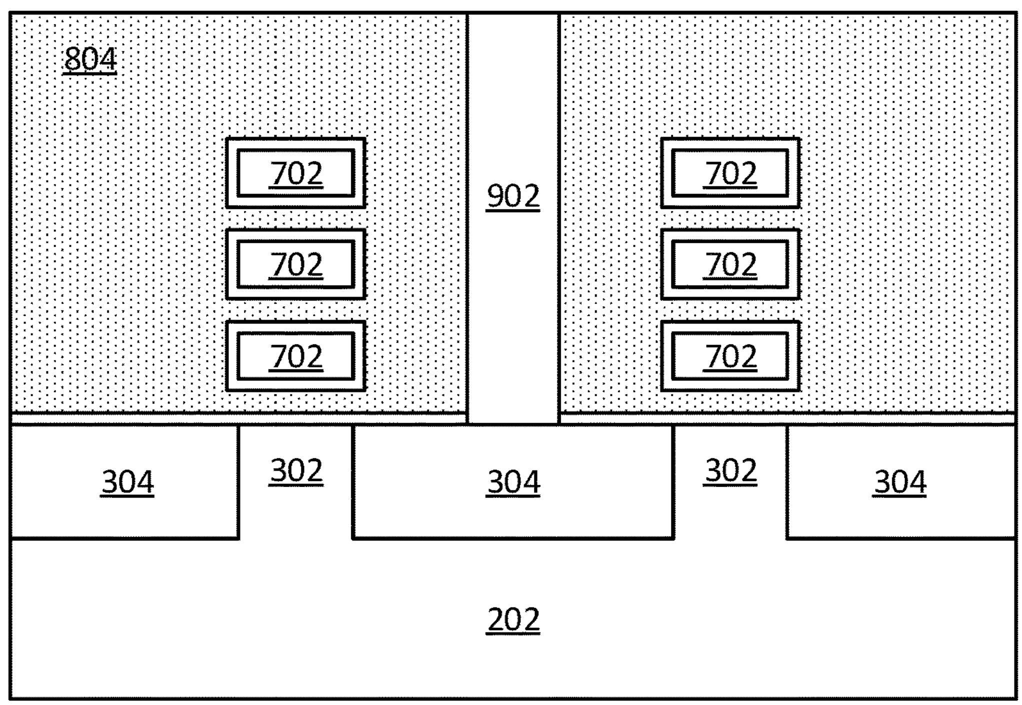
FIGS. 12A and 12B are cross-sectional views that illustrate another stage in the example process for forming an integrated circuit configured with gate cut structures formed after gate metallization, in accordance with an embodiment of the present disclosure.
Figure 12B:
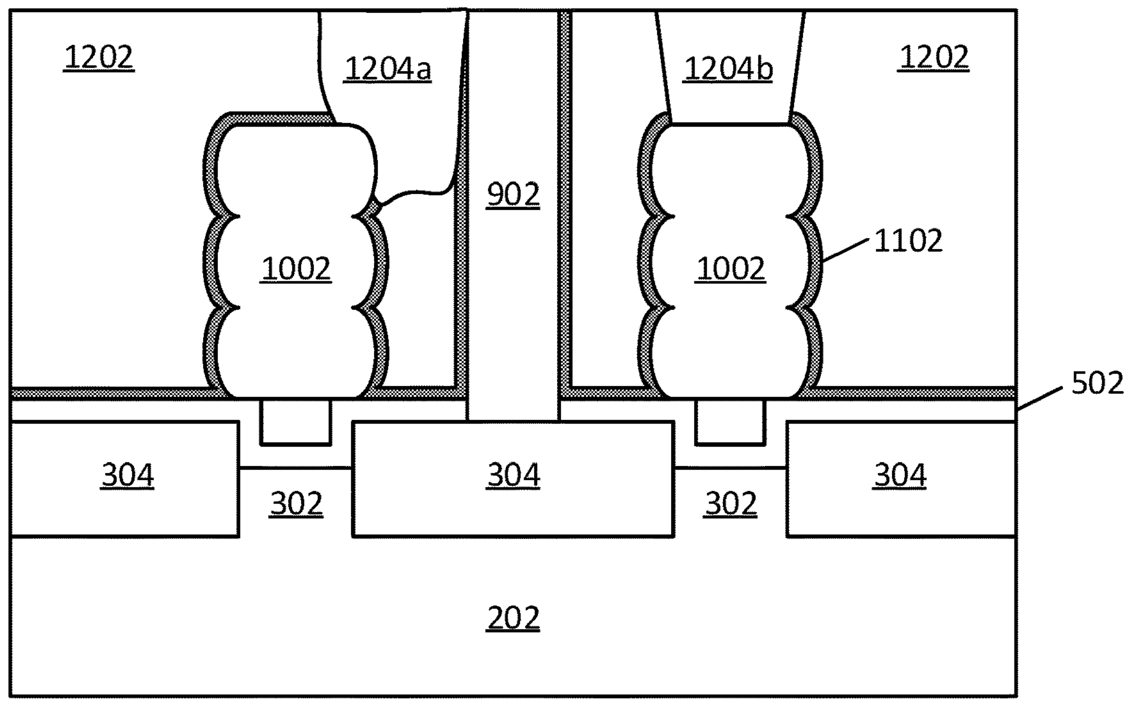

FIGS. 12A and 12B depict the cross-section views of the structure shown in FIGS. 11A and 11B, respectively, following the formation of a dielectric fill 1202 within the source/drain trench. Dielectric fill 1202 may be used to plug any additional space within the source/drain trench and can include any suitable dielectric material. In some examples, dielectric fill 1202 includes silicon oxide. In some examples, dielectric fill 1202 includes the same dielectric material as gate cut structure 902. A top surface of dielectric fill 1202 may be polished using, for example, CMP to planarize the top surface along with a top surface of the gate structure. The polishing may also remove any portions of dielectric liner 1102 over the gate structure.

Contacts 1204 can then be formed by, for example, etching a contact trench through dielectric fill 1202 over the source and drain regions 1002 and further etching through the dielectric liner 1102 to reach a top surface of the source and drain regions 1002. The contacts 1204 can then be formed within the contact trench, on the source and drain regions 1002. The contacts 1204 may include multiple layers, such as a barrier layer (e.g., tantalum or tantalum nitride to reduce electromigration of contact metal into the dielectric fill), a resistance reducing layer (e.g., doped silicon or silicon germanium capping layer), and a metal plug (e.g., tungsten, copper, ruthenium). Note how formation of contacts 1204 may cause removal of some or all of the uppermost portion of dielectric liner 1102, depending on factors such as how well a given contact 1204 lands on the source/drain region 1002 and how wide the bottom surface of contact 1204 is relative to the upper width of the source/drain region 1002.

Note that contacts 1204 may be well-aligned so as to fully land on a corresponding source or drain region 1002 (such as the case with contact 1204*b*), or contacts 1204 may be not-so-well-aligned so as to only partially land on a corresponding source or drain region 1002 (such as the case with contact 1204*a*). Such unintentional misalignment and partial landing may be acceptable, given that the gate cut structure 902 will prevent contact 1204*a* from shorting or otherwise coming close to neighboring contact 1204*b*. To this end, in some embodiments, the etch scheme that is used to etch the contact trench through dielectric fill 1202 (e.g., silicon dioxide) and dielectric liner 1102 (e.g., silicon oxycarbide or silicon nitride) is selective to the dielectric material of gate structure 902 (e.g., silicon nitride), thus providing a degree of self-alignment for the contact trench etch process. In this manner, the process margin for patterning contacts 1204 is improved or otherwise allows for a looser alignment tolerance.

Figure 13:
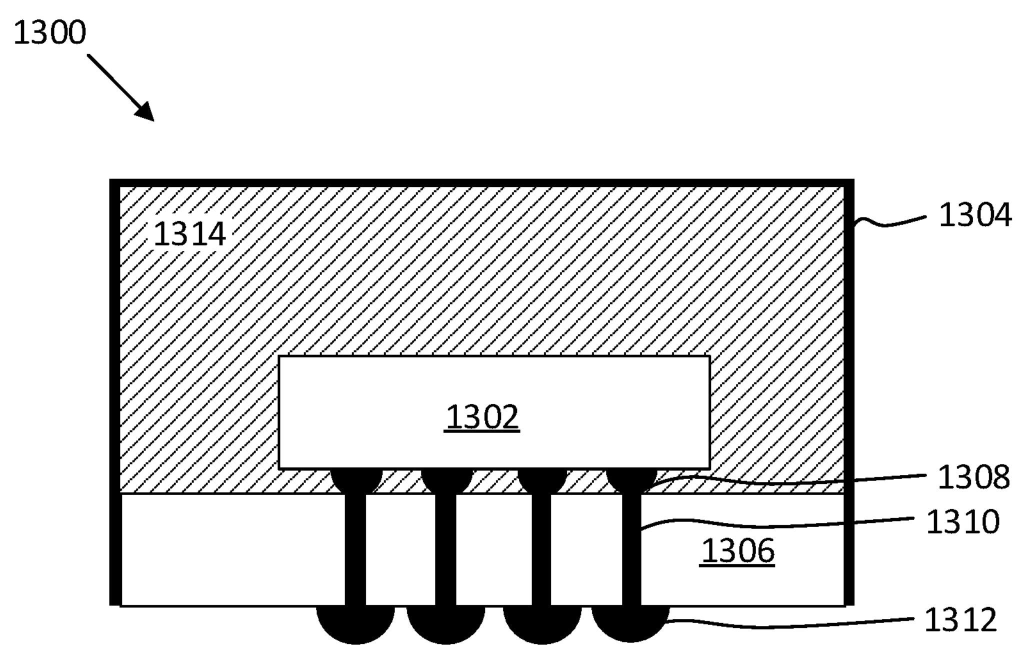
FIG. 13 illustrates a cross-section view of a chip package containing one or more semiconductor dies, in accordance with some embodiments of the present disclosure.

FIG. 13 illustrates an example embodiment of a chip package 1300. As can be seen, chip package 1300 includes one or more dies 1302. One or more dies 1302 may include at least one integrated circuit having semiconductor devices, such as any of the semiconductor devices disclosed herein. One or more dies 1302 may include any other circuitry used to interface with other devices formed on the dies, or other devices connected to chip package 1300, in some example configurations.

As can be further seen, chip package 1300 includes a housing 1304 that is bonded to a package substrate 1306. The housing 1304 may be any standard or proprietary housing, and provides, for example, electromagnetic shielding and environmental protection for the components of chip package 1300. The one or more dies 1302 may be conductively coupled to a package substrate 1306 using connections 1308, which may be implemented with any number of standard or proprietary connection mechanisms, such as solder bumps, ball grid array (BGA), pins, or wire bonds, to name a few examples. Package substrate 1306 may be any standard or proprietary package substrate, but in some cases includes a dielectric material having conductive pathways (e.g., including conductive vias and lines) extending through the dielectric material between the faces of package substrate 1306, or between different locations on each face. In some embodiments, package substrate 1306 may have a thickness less than 1 millimeter (e.g., between 0.1 millimeters and 0.5 millimeters), although any number of package geometries can be used. Additional conductive contacts 1312 may be disposed at an opposite face of package substrate 1306 for conductively contacting, for instance, a printed circuit board (PCB). One or more vias 1310 extend through a thickness of package substrate 1306 to provide conductive pathways between one or more of connections 1308 to one or more of contacts 1312. Vias 1310 are illustrated as single straight columns through package substrate 1306 for ease of illustration, although other configurations can be used (e.g., damascene, dual damascene, through-silicon via). In still other embodiments, vias 1310 are fabricated by multiple smaller stacked vias, or are staggered at different locations across package substrate 1306. In the illustrated embodiment, contacts 1312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1312, to inhibit shorting.

In some embodiments, a mold material 1314 may be disposed around the one or more dies 1302 included within housing 1304 (e.g., between dies 1302 and package substrate 1306 as an underfill material, as well as between dies 1302 and housing 1304 as an overfill material). Although the dimensions and qualities of the mold material 1314 can vary from one embodiment to the next, in some embodiments, a thickness of mold material 1314 is less than 1 millimeter. Example materials that may be used for mold material 1314 include epoxy mold materials, as suitable. In some cases, the mold material 1314 is thermally conductive, in addition to being electrically insulating.

Methodology

Figure 14:
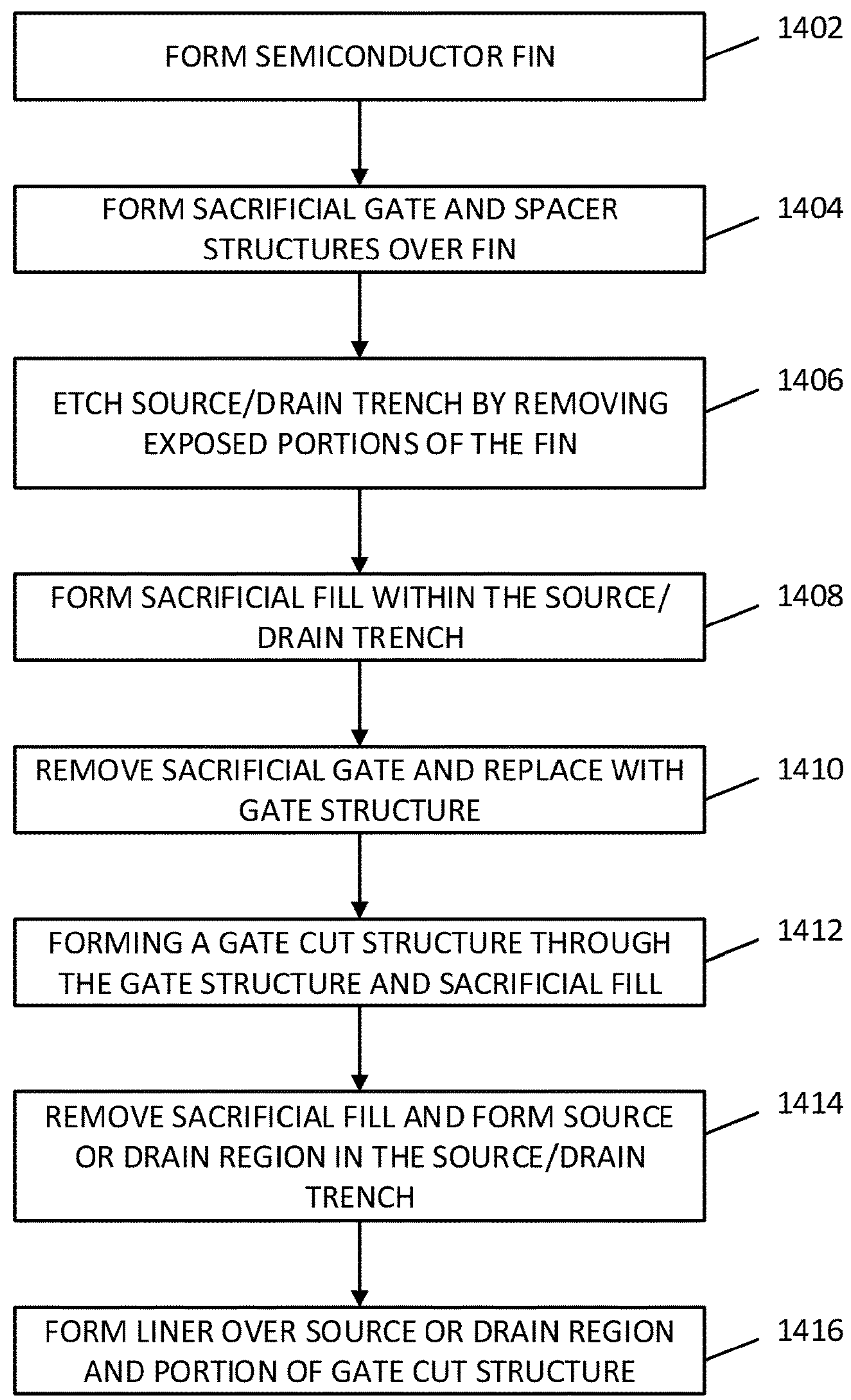
FIG. 14 is a flowchart of a fabrication process for semiconductor device having gate cut structures formed after gate metallization, in accordance with an embodiment of the present disclosure.

FIG. 14 is a flow chart of a method 1400 for forming at least a portion of an integrated circuit, according to an embodiment. Various operations of method 1400 may be illustrated in FIGS. 2A-12A and 2B-12B. However, the correlation of the various operations of method 1400 to the specific components illustrated in the aforementioned figures is not intended to imply any structural and/or use limitations. Rather, the aforementioned figures provide one example embodiment of method 1400. Other operations may be performed before, during, or after any of the operations of method 1400. Some of the operations of method 1400 may be performed in a different order than the illustrated order.

Method 1400 begins with operation 1402 where at least one semiconductor fin is formed, according to some embodiments. The semiconductor material in the at least one fin may be formed from a substrate such that the fin is an integral part of the substrate (e.g., etched from a bulk silicon substrate). Alternatively, the fin can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins, or deposited into fin-shaped trenches.

Method 1400 continues with operation 1404 where sacrificial gates and spacer structures are formed over a portion of the fin. The sacrificial gates may be patterned in parallel strips running in an orthogonal direction across the fin. The sacrificial gates may include any material that can be safely removed later in the process without etching or otherwise damaging the spacer structures and/or the fin. The sacrificial gates may include polysilicon while the spacer structures may include silicon nitride. The spacer structures are formed on sidewalls of the sacrificial gates and etched back to remove the spacer structure material from any horizontal surfaces.

Method 1400 continues with operation 1406 where a source/drain trench is etched through the fin between adjacent sacrificial gates and sidewall spacers. The fin material may be removed using an anisotropic etching process that can continue further past the height of the fin and into at least a portion of a subfin region beneath the fin.

Method 1400 continues with operation 1408 where a sacrificial fill is formed within the source/drain trench. The sacrificial fill material may plug an entirety of the source/drain trench running between a given pair of sacrificial gates. According to some embodiments, the sacrificial fill includes any material that can be selectively removed at a later time without causing damage to the adjacent structures. Some example materials for the sacrificial fill include titanium nitride (TiN), aluminum oxide ($Al_2O_3$), or tungsten (W).

Method 1400 continues with operation 1410 where the sacrificial gates are removed and replaced with gate structures. The sacrificial gates may be removed using an isotropic etching process that selectively removes all of the material from the sacrificial gates, thus exposing any fins between the spacer structures. In the example case where GAA transistors are used, any sacrificial layers within the exposed fins between the spacer structures are also removed to leave behind nanoribbons, nanosheets, or nanowires of semiconductor material.

The gate structures may include a gate dielectric and a gate layer, which may represent any number of conductive layers to form a gate electrode. The gate dielectric is first formed over the exposed semiconductor regions between the spacer structures followed by forming the gate layer within the remainder of the trench between the spacer structures, according to some embodiments. The gate dielectric may include any number of dielectric layers deposited using a CVD process, such as ALD. The gate layer can include any conductive material, such as a metal, metal alloy, or polysilicon. The gate layer may be deposited using electroplating, electroless plating, CVD, ALD, PECVD, or PVD, to name a few examples.

Method 1400 continues with operation 1412 where a gate cut structure is formed through a given gate structure and an adjacent sacrificial fill within the source/drain trench. The gate cut structure may extend lengthwise in an orthogonal direction compared to a length of the gate structures. Accordingly, the gate cut structure interrupts the gate structure (and specifically at least the gate layer) and also cuts through sacrificial fill 602.

An anisotropic etching process may be performed through the various materials, such as the gate layer, the spacer structures, and the sacrificial fill to define a trench-like recess for the gate cut structure, according to some embodiments. The recess may then be filled with one or more dielectric materials to form the gate cut structure. In some examples, the gate cut structure includes silicon oxide, silicon nitride, or silicon oxynitride. According to some embodiments, the gate dielectric is not present along the sidewalls of the gate cut structure, since the gate cut structure is formed after the formation of the gate structure.

Method 1400 continues with operation 1414, where the sacrificial fill is removed and the source or drain regions are formed. The source or drain regions may be epitaxially grown from the exposed ends of semiconductor layers from adjacent devices, such that the material grows together towards the middle of the source/drain trench. In the example of PMOS devices, the source or drain regions may be a semiconductor material (e.g., group IV or group III-V semiconductor materials) having a higher dopant concentration of p-type dopants compared to n-type dopants. In the example of NMOS devices, the source or drain regions may be a semiconductor material (e.g., group IV or group III-V semiconductor materials) having a higher dopant concentration of n-type dopants compared to p-type dopants.

Method 1400 continues with operation 1416 where a dielectric liner is formed over the source or drain regions and up at least a portion of a sidewall of the gate cut structure in the source/drain trench. The dielectric liner may include any suitable dielectric material to protect the underlying source or drain region. In one example, the dielectric liner includes silicon nitride. Since the gate cut structure is formed before the growth of the source or drain regions, the dielectric liner is present along at least a portion of the sidewalls of the gate cut structure. In examples where a given source or drain region grows against an adjacent gate cut structure, the dielectric liner may be present on the sidewall portion of the gate cut structure only above where contact is made between the gate cut structure and the source or drain region.

In some embodiments, method 1400 may further include forming a contact on one or more of the source or drain regions. In some such cases, the one or more contacts are formed by etching a contact trench through the dielectric fill material over the source or drain region and further etching through the dielectric liner to reach a top surface of the source or drain region. The contact can then be formed within the contact trench, on the source or drain region. As previously explained above, the contact may include multiple layers, such as a barrier layer, a resistance reducing layer, and/or a metal plug. Any number of contact structure configurations can be used.

Example System

Figure 15:
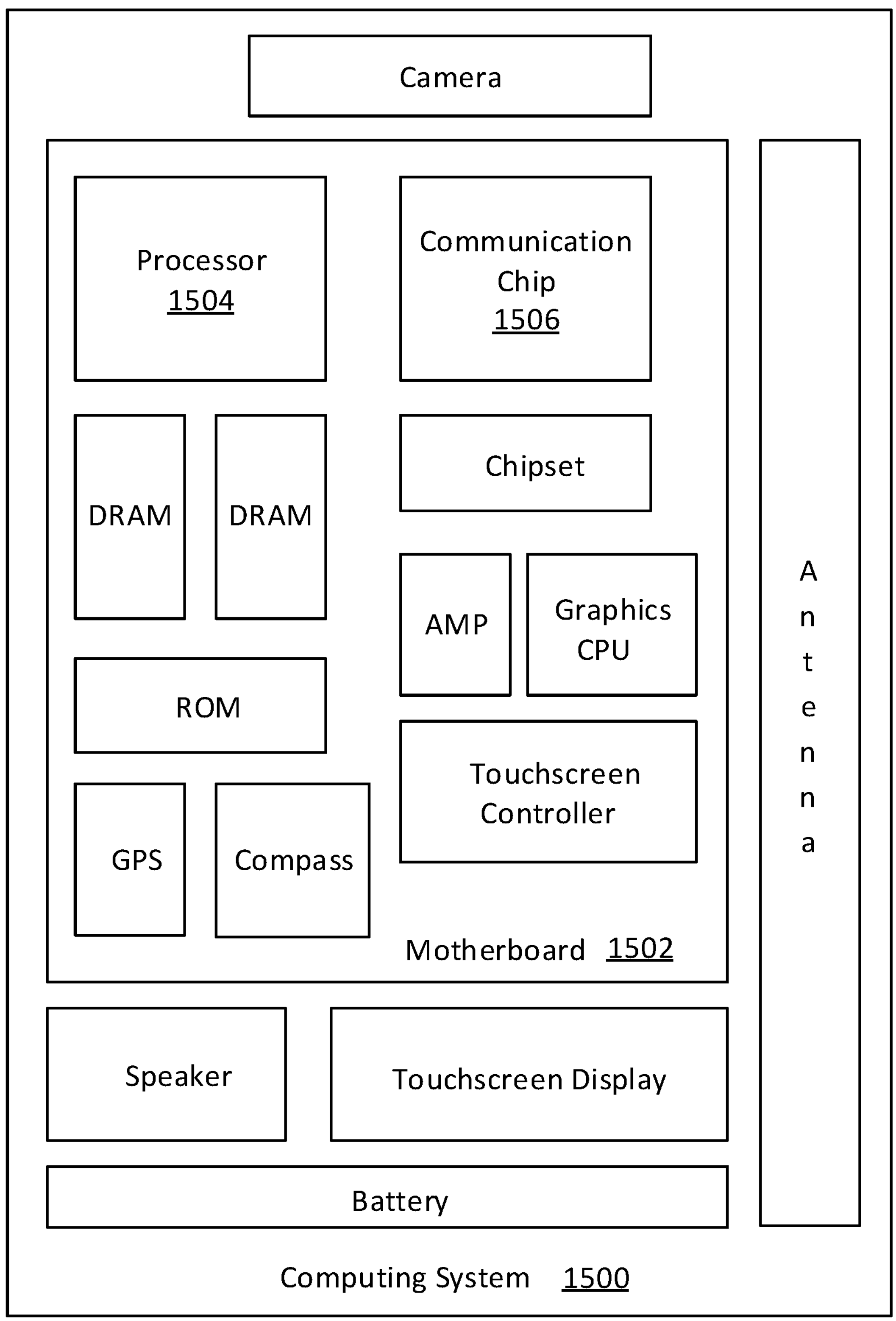
FIG. 15 illustrates a computing system including one or more integrated circuits, as variously described herein, in accordance with an embodiment of the present disclosure.

FIG. 15 is an example computing system implemented with one or more of the integrated circuit structures as disclosed herein, in accordance with some embodiments of the present disclosure. As can be seen, the computing system 1500 houses a motherboard 1502. The motherboard 1502 may include a number of components, including, but not limited to, a processor 1504 and at least one communication chip 1506, each of which can be physically and electrically coupled to the motherboard 1502, or otherwise integrated therein. As will be appreciated, the motherboard 1502 may be, for example, any printed circuit board (PCB), whether a main board, a daughterboard mounted on a main board, or the only board of system 1500, etc.

Depending on its applications, computing system 1500 may include one or more other components that may or may not be physically and electrically coupled to the motherboard 1502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1500 may include one or more integrated circuit structures or devices configured in accordance with an example embodiment (e.g., a module including an integrated circuit device on a substrate, the substrate having one or more semiconductor devices with gate cut structures formed after gate metallization, as variously provided herein). In some embodiments, multiple functions can be integrated into one or more chips (e.g., for instance, note that the communication chip 1506 can be part of or otherwise integrated into the processor 1504).

The communication chip 1506 enables wireless communications for the transfer of data to and from the computing system 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing system 1500 includes an integrated circuit die packaged within the processor 1504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1506 also may include an integrated circuit die packaged within the communication chip 1506. In accordance with some such example embodiments, the integrated circuit die of the communication chip includes one or more semiconductor devices as variously described herein. As will be appreciated in light of this disclosure, note that multi-standard wireless capability may be integrated directly into the processor 1504 (e.g., where functionality of any chips 1506 is integrated into processor 1504, rather than having separate communication chips). Further note that processor 1504 may be a chip set having such wireless capability. In short, any number of processor 1504 and/or communication chips 1506 can be used. Likewise, any one chip or chip set can have multiple functions integrated therein.

In various implementations, the computing system 1500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a semiconductor device having a semiconductor region extending between a first source or drain region and a second source or drain region, a gate layer comprising a conductive material and extending over the semiconductor region, and a gate cut structure comprising a dielectric material. The gate cut structure is adjacent to the semiconductor region such that the gate cut structure interrupts the gate layer and further extends adjacent to the first source or drain region. The integrated circuit further includes a dielectric liner on at least a sidewall and/or top surface of the first source or drain region and also on at least a portion of a sidewall of the gate cut structure adjacent to the first source or drain region.

Example 2 includes the subject matter of Example 1, wherein the semiconductor region includes a fin that comprises silicon.

Example 3 includes the subject matter of Example 1 or 2, wherein the semiconductor region comprises a plurality of semiconductor nanoribbons.

Example 4 includes the subject matter of Example 3, wherein the plurality of semiconductor nanoribbons comprise germanium, silicon, or a combination thereof Example 5 includes the subject matter of any one of Examples 1-4, wherein the dielectric material of the gate cut structure comprises silicon and nitrogen or comprises silicon and oxygen.

Example 6 includes the subject matter of any one of Examples 1-5, wherein the dielectric material of gate cut structure is a first dielectric material and the dielectric liner comprises a second dielectric material that is elementally different than the first dielectric material.

Example 7 includes the subject matter of any one of Examples 1-6, wherein the gate cut structure is a first gate cut structure adjacent to a first side of the first source or drain region and the integrated circuit further comprises a second gate cut structure adjacent to an opposite second side of the first source or drain region.

Example 8 includes the subject matter of any one of Examples 1-7, wherein the dielectric liner is on at least one sidewall of the first source or drain region.

Example 9 includes the subject matter of Example 8, wherein the dielectric liner continues along the at least one sidewall of the first source or drain region and along the sidewall of the gate cut structure without any discontinuities between the first source or drain region and the gate cut structure.

Example 10 includes the subject matter of any one of Examples 1-9, further comprising a gate dielectric between the gate layer and the semiconductor region, wherein the gate dielectric is not present on a sidewall of the gate cut structure.

Example 11 includes the subject matter of any one of Examples 1-10, further comprising a contact at least partially landed on an upper surface of the first source or drain region.

Example 12 is a printed circuit board comprising the integrated circuit of any one of Examples 1-11.

Example 13 is an electronic device having a chip package that includes one or more dies. At least one of the one or more dies includes a semiconductor device having a semiconductor region extending between a first source or drain region and a second source or drain region, a gate layer comprising a conductive material and extending over the semiconductor region, and a gate cut structure comprising a dielectric material. The gate cut structure is adjacent to the semiconductor region such that the gate cut structure interrupts the gate layer and further extends adjacent to the first source or drain region. The integrated circuit further includes a dielectric liner on at least a sidewall and/or top surface of the first source or drain region and also on at least a portion of a sidewall of the gate cut structure adjacent to the first source or drain region.

Example 14 includes the subject matter of Example 13, wherein the semiconductor region includes a fin that comprises silicon.

Example 15 includes the subject matter of Example 13 or 14, wherein the semiconductor region comprises a plurality of semiconductor nanoribbons.

Example 16 includes the subject matter of Example 15, wherein the plurality of semiconductor nanoribbons comprise germanium, silicon, or a combination thereof Example 17 includes the subject matter of any one of Examples 13-16, wherein the dielectric material of the gate cut structure comprises silicon and nitrogen or comprises silicon and oxygen.

Example 18 includes the subject matter of any one of Examples 13-17, wherein the dielectric material of the gate cut structure is a first dielectric material and the dielectric liner comprises a second dielectric material that is elementally different than the first dielectric material.

Example 19 includes the subject matter of any one of Examples 13-18, wherein the gate cut structure is a first gate cut structure adjacent to a first side of the first source or drain region and the at least one of the one or more dies further comprises a second gate cut structure adjacent to an opposite second side of the first source or drain region.

Example 20 includes the subject matter of any one of Examples 13-19, wherein the dielectric liner is on at least one sidewall of the first source or drain region.

Example 21 includes the subject matter of Example 20, wherein the dielectric liner continues along the at least one sidewall of the first source or drain region and along the sidewall of the gate cut structure without any discontinuities between the first source or drain region and the gate cut structure.

Example 22 includes the subject matter of any one of Examples 13-21, wherein the at least one of the one or more dies further comprises a gate dielectric between the gate layer and the semiconductor region, wherein the gate dielectric is not present on a sidewall of the gate cut structure.

Example 23 includes the subject matter of any one of Examples 13-22, further comprising a printed circuit board, wherein the chip package is attached to the printed circuit board.

Example 24 is a method of forming an integrated circuit. The method includes forming a fin comprising semiconductor material extending above a substrate surface; forming a sacrificial gate layer over the semiconductor material of the fin; forming a spacer structure on sidewalls of the sacrificial gate layer; removing exposed portions of the fin outside of the sacrificial gate layer and spacer structure; forming a sacrificial fill material adjacent to the spacer structure; replacing the sacrificial gate layer with a conductive gate layer; forming a gate cut structure comprising a dielectric material that extends through a width of the conductive gate layer and through the sacrificial fill material; removing the sacrificial fill material; forming a source or drain region from the exposed end or ends of the semiconductor material; and forming a dielectric liner over at least a sidewall and/or top surface of the source or drain region and over a portion of a sidewall surface of the gate cut structure adjacent to the source or drain region.

Example 25 includes the subject matter of Example 24, wherein forming the fin comprises recessing a dielectric layer adjacent to the fin such that the fin extends above a top surface of the dielectric layer.

Example 26 includes the subject matter of Example 24 or 25, wherein the fin comprises one or more first layers of first semiconductor material alternating with one or more second layers of second semiconductor material, the first semiconductor material being different than the second semiconductor material.

Example 27 includes the subject matter of any one of Examples 24-26, wherein forming the source or drain region comprises epitaxially growing the source or drain region from the exposed end or ends of the semiconductor material.

Example 28 includes the subject matter of any one of Examples 24-27, wherein forming the dielectric liner further comprises forming the dielectric liner over a sidewall of the source or drain region.

Example 29 includes the subject matter of Example 28, wherein forming the dielectric liner further comprises forming the dielectric liner along the sidewall surface of the gate cut structure adjacent to the source or drain region without any discontinuities in the dielectric liner between the source or drain region and the gate cut structure.

Example 30 is an integrated circuit that includes a semiconductor device having a semiconductor region extending between a first source or drain region and a second source or drain region, a gate layer comprising a conductive material and extending over the semiconductor region, and a gate cut structure comprising a dielectric material. The gate cut structure is adjacent to the semiconductor region such that the gate cut structure interrupts the gate layer and further extends adjacent to the first source or drain region. The integrated circuit further includes a dielectric liner on at least a sidewall and/or top surface of the first source or drain region. The first source or drain region contacts the adjacent gate cut structure at a given contact point and the dielectric liner is further on a sidewall portion of the gate cut structure that is only above the contact point.

Example 31 includes the subject matter of Example 30, wherein the semiconductor region includes a fin that comprises silicon.

Example 32 includes the subject matter of Example 30 or 31, wherein the semiconductor region comprises a plurality of semiconductor nanoribbons.

Example 33 includes the subject matter of Example 32, wherein the plurality of semiconductor nanoribbons comprise germanium, silicon, or a combination thereof Example 34 includes the subject matter of any one of Examples 30-33, wherein the dielectric material of the gate cut structure comprises silicon and nitrogen or comprises silicon and oxygen.

Example 35 includes the subject matter of any one of Examples 30-34, wherein the dielectric material of gate cut structure is a first dielectric material and the dielectric liner comprises a second dielectric material that is elementally different than the first dielectric material.

Example 36 includes the subject matter of any one of Examples 30-35, wherein the gate cut structure is a first gate cut structure adjacent to a first side of the first source or drain region and the integrated circuit further comprises a second gate cut structure adjacent to an opposite second side of the first source or drain region.

Example 37 includes the subject matter of any one of Examples 30-36, wherein the dielectric liner is on at least one sidewall of the first source or drain region.

Example 38 includes the subject matter of Example 37, wherein the dielectric liner continues along the at least one sidewall of the first source or drain region and along the sidewall of the gate cut structure above the contact point without any discontinuities between the first source or drain region and the gate cut structure.

Example 39 includes the subject matter of any one of Examples 30-38, further comprising a gate dielectric between the gate layer and the semiconductor region, wherein the gate dielectric is not present on a sidewall of the gate cut structure.

Example 40 is a printed circuit board comprising the integrated circuit of any one of Examples 30-39.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a semiconductor device having a semiconductor region extending between a first source or drain region and a second source or drain region;

a gate layer comprising a conductive material, the gate layer extending over the semiconductor region;

a gate cut structure comprising a dielectric material, the gate cut structure being adjacent to the semiconductor region such that the gate cut structure interrupts the gate layer, the gate cut structure further extending adjacent to the first source or drain region;

a dielectric liner on at least a sidewall and/or top surface of the first source or drain region and also on at least a portion of a sidewall of the gate cut structure adjacent to the first source or drain region; and a gate dielectric between the gate layer and the semiconductor region, wherein the gate dielectric is not present on a sidewall of the gate cut structure.

2. The integrated circuit of claim 1, wherein the semiconductor region comprises a plurality of semiconductor nanoribbons.

3. The integrated circuit of claim 1, wherein the dielectric material of the gate cut structure is a first dielectric material and the dielectric liner comprises a second dielectric material that is elementally different than the first dielectric material.

4. The integrated circuit of claim 1, wherein the gate cut structure is a first gate cut structure adjacent to a first side of the first source or drain region and the integrated circuit further comprises a second gate cut structure adjacent to an opposite second side of the first source or drain region.

5. The integrated circuit of claim 1, wherein the dielectric liner is on at least one sidewall of the first source or drain region.

6. The integrated circuit of claim 5, wherein the dielectric liner continues along the at least one sidewall of the first source or drain region and along the sidewall of the gate cut structure without any discontinuities between the first source or drain region and the gate cut structure.

7. A printed circuit board comprising the integrated circuit of claim 1.

8. The integrated circuit of claim 1, further comprising a contact at least partially on an upper surface of the first source or drain region.

9. An electronic device, comprising:

a chip package comprising one or more dies, at least one of the one or more dies comprising a semiconductor device having a semiconductor region extending between a first source or drain region and a second source or drain region;

a gate layer comprising a conductive material, the gate layer extending over the semiconductor region;

a gate cut structure comprising a dielectric material, the gate cut structure being adjacent to the semiconductor region such that the gate cut structure interrupts the gate layer, the gate cut structure further extending adjacent to the first source or drain region;

a dielectric liner on at least a sidewall and/or top surface of the first source or drain region and on at least a portion of a sidewall of the gate cut structure adjacent to the first source or drain region; and a gate dielectric between the gate layer and the semiconductor region, wherein the gate dielectric is not present on a sidewall of the gate cut structure.

10. The electronic device of claim 9, wherein the semiconductor region comprises a plurality of semiconductor nanoribbons.

11. The electronic device of claim 9, wherein the dielectric material of the gate cut structure is a first dielectric material and the dielectric liner comprises a second dielectric material that is elementally different than the first dielectric material.

12. The electronic device of claim 9, wherein the dielectric liner is on at least one sidewall of the first source or drain region.

13. The electronic device of claim 12, wherein the dielectric liner continues along the at least one sidewall of the first source or drain region and along the sidewall of the gate cut structure without any discontinuities between the first source or drain region and the gate cut structure.

14. The electronic device of claim 9, wherein the at least one of the one or more dies further comprises a contact at least partially on an upper surface of the first source or drain region.

15. An integrated circuit comprising:

a semiconductor device having a semiconductor region extending between a first source or drain region and a second source or drain region;

a gate layer comprising a conductive material, the gate layer extending over the semiconductor region;

a gate cut structure comprising a dielectric material, the gate cut structure being adjacent to the semiconductor region such that the gate cut structure interrupts the gate layer, the gate cut structure further extending adjacent to the first source or drain region;

a dielectric liner on at least a sidewall and/or top surface of the first source or drain region; and a gate dielectric between the gate layer and the semiconductor region, wherein the gate dielectric is not present on a sidewall of the gate cut structure, and wherein the first source or drain region contacts the adjacent gate cut structure at a given contact point and wherein the dielectric liner is further on a sidewall portion of the gate cut structure that is only above the contact point.

16. The integrated circuit of claim 15, wherein the semiconductor region comprises a plurality of semiconductor nanoribbons.

17. The integrated circuit of claim 15, wherein the dielectric material of the gate cut structure is a first dielectric material and the dielectric liner comprises a second dielectric material that is elementally different than the first dielectric material.

18. The integrated circuit of claim 15, wherein the dielectric liner is on at least one sidewall of the first source or drain region.

19. The integrated circuit of claim 18, wherein the dielectric liner continues along the at least one sidewall of the first source or drain region and along the sidewall of the gate cut structure without any discontinuities between the first source or drain region and the gate cut structure.

20. The integrated circuit of claim 15, further comprising a contact at least partially on an upper surface of the first source or drain region.

* * * * *